(12) United States Patent
Ahn et al.

(10) Patent No.: US 10,703,967 B2
(45) Date of Patent: Jul. 7, 2020

(54) QUANTUM DOTS, A COMPOSITION OR COMPOSITE INCLUDING THE SAME, AND AN ELECTRONIC DEVICE INCLUDING THE SAME

(71) Applicants: SAMSUNG ELECTRONICS CO., LTD., Suwon-si, Gyeonggi-do (KR); SAMSUNG SDI CO., LTD., Yongin-si, Gyeonggi-do (KR); Samsung Display Co., Ltd., Yongin-si, Gyeonggi-do (KR)

(72) Inventors: Jooyeon Ahn, Suwon-si (KR); Ha Il Kwon, Suwon-si (KR); Shang Hyeun Park, Yongin-si (KR); Nayoun Won, Suwon-si (KR); Eun Joo Jang, Suwon-si (KR); Shin Ae Jun, Seongnam-si (KR)

(73) Assignees: SAMSUNG DISPLAY CO., LTD., Gyeonggi-Do (KR); SAMSUNG SDI CO., LTD., Gyeonggi-Do (KR); SAMSUNG ELECTRONICS CO., LTD., Gyeonggi-Do (KR)

( * ) Notice: Subject to any disclaimer, the term of this patent is extended or adjusted under 35 U.S.C. 154(b) by 46 days.

(21) Appl. No.: 15/820,781

(22) Filed: Nov. 22, 2017

(65) Prior Publication Data

US 2018/0148638 A1 May 31, 2018

(30) Foreign Application Priority Data

Nov. 25, 2016 (KR) .................. 10-2016-0158704
Dec. 20, 2016 (KR) .................. 10-2016-0174971

(51) Int. Cl.
*C09K 11/02* (2006.01)
*C09K 11/70* (2006.01)
(Continued)

(52) U.S. Cl.
CPC ............ *C09K 11/025* (2013.01); *C09K 11/06* (2013.01); *C09K 11/703* (2013.01);
(Continued)

(58) Field of Classification Search
CPC ..... C09K 11/025; C09K 11/06; C09K 11/703; C09K 11/883; C09K 2211/188;
(Continued)

(56) References Cited

U.S. PATENT DOCUMENTS 7,476,487 B2  1/2009  Park et al.
7,746,423 B2  6/2010  Im et al.
(Continued)

FOREIGN PATENT DOCUMENTS

EP  3070756 A1  9/2016
EP  3187564 A1  7/2017
(Continued)

OTHER PUBLICATIONS

Di Liu et al., "Water-Soluble Semiconductor Nanocrystals Cap Exchanged with Metalated Ligands," ACS NANO, DOI: 10.1021/nn1025934, Dec. 8, 2010, pp. 546-550, vol. 5, No. 1, 2011 Amenrical Chemical Society (www.acsnano.org).

(Continued)

*Primary Examiner* — Ruiyun Zhang
(74) *Attorney, Agent, or Firm* — Cantor Colburn LLP

(57) ABSTRACT

A quantum dot including a first ligand and a second ligand on a surface of the quantum dot, a composition or composite including the same, and a device including the same. The first ligand includes a compound represented by Chemical Formula 1 and the second ligand includes a compound represented by Chemical Formula 2:

$$MA_n \qquad \text{Chemical Formula 1}$$

(Continued)

wherein M, n, and A are the same as defined in the specification; and

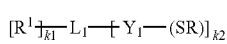

Chemical Formula 2 wherein,
$R^1$, $L_1$, $Y_1$, R, k1, and k2 are the same as defined in the specification.

29 Claims, 5 Drawing Sheets

(51) Int. Cl.
| | |
|---|---|
| C09K 11/88 | (2006.01) |
| F21V 8/00 | (2006.01) |
| C09K 11/06 | (2006.01) |
| H01L 51/00 | (2006.01) |
| H01L 51/50 | (2006.01) |
| H05B 33/14 | (2006.01) |
| B82Y 20/00 | (2011.01) |
| B82Y 40/00 | (2011.01) |

(52) U.S. Cl.
CPC ............ *C09K 11/883* (2013.01); *G02B 6/005* (2013.01); *H01L 51/0035* (2013.01); *H01L 51/0037* (2013.01); *H01L 51/0039* (2013.01); *H01L 51/0092* (2013.01); *H01L 51/502* (2013.01); *H05B 33/14* (2013.01); *B82Y 20/00* (2013.01); *B82Y 40/00* (2013.01); *C09K 2211/188* (2013.01); *H01L 51/5012* (2013.01); *H01L 51/5056* (2013.01); *H01L 51/5088* (2013.01); *Y10S 977/774* (2013.01); *Y10S 977/783* (2013.01); *Y10S 977/818* (2013.01); *Y10S 977/824* (2013.01); *Y10S 977/892* (2013.01); *Y10S 977/896* (2013.01); *Y10S 977/95* (2013.01); *Y10T 428/1036* (2015.01); *Y10T 428/1041* (2015.01)

(58) Field of Classification Search
CPC ........ B82Y 20/00; B82Y 30/00; G02B 6/005; Y10S 977/774; H01L 51/0092; H01L 51/502; Y10T 428/1036; Y10T 428/1041
USPC ........... 428/1.1, 1.3, 1.31; 257/12, 40; 529/3
See application file for complete search history.

(56) References Cited

U.S. PATENT DOCUMENTS

| | | | |
|---|---|---|---|
| 8,895,319 B2 | 11/2014 | Koo et al. | |
| 9,196,682 B2 | 11/2015 | Jang et al. | |
| 9,212,056 B2 | 12/2015 | Breen et al. | |
| 2011/0017951 A1 | 1/2011 | Ryowa | |
| 2013/0099213 A1* | 4/2013 | Jun | C09K 11/02 257/40 |
| 2014/0151612 A1 | 6/2014 | Cho et al. | |
| 2015/0098212 A1* | 4/2015 | Won | G02F 1/133615 362/97.3 |
| 2016/0005932 A1 | 1/2016 | Lee et al. | |
| 2016/0011506 A1* | 1/2016 | Gu | G03F 7/027 430/288.1 |
| 2017/0082892 A1 | 3/2017 | Chung | |
| 2017/0176816 A1 | 6/2017 | Han et al. | |
| 2017/0247613 A1 | 8/2017 | Ono | |
| 2018/0151817 A1 | 5/2018 | Cho et al. | |

FOREIGN PATENT DOCUMENTS

| | | | |
|---|---|---|---|
| JP | 201493327 A | 5/2014 | |
| KR | 1020120028670 A | 3/2012 | |
| KR | 1020120050145 A | 5/2012 | |
| KR | 101212656 B1 | 12/2012 | |
| KR | 1020130044071 A | 5/2013 | |
| KR | 1020130114436 A | 10/2013 | |
| KR | 1020150072089 A | 6/2015 | |
| KR | 1020170034055 A | 3/2017 | |
| KR | 1020170072418 A | 6/2017 | |
| WO | 2015002565 A1 | 1/2015 | |

OTHER PUBLICATIONS

Extended European Search Report dated Mar. 2, 2018, of the corresponding European Patent Application No. 17203145.2.
Extended European Search Report dated Mar. 5, 2018, of the corresponding European Patent Application No. 17203152.8.
Adis Khetubol, et al., "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands", Journal of Polymer Science, Part B: Polymer Phrsics 2014, 52, 539-551.
Bing Bai, et al., "Quaternary CU2ZnSnS4 quantum dot-sensitized solar cells: Synthesis, passivation and ligand exchange", Journal of Power Sources 318 (2016) 35-40.
Cherie R. Kagan, et al., "Charge transport in strongly coupled quantum dot solids", NNano, 2015, 15 pp.
Chih-Hung Chen, et al., "Thiol treatment to enhance photoluminescence and electroluminescence of CdSe/CdS core-shell quantum dots prepared by thermal cycling of single source precursors", RSC Adv. 2015, 5, 9819.
Evren Mutlugun, et al., "Colloidal Quantum Dot Light-Emitting Diodes Employing Phosphorescent Small Organic Moleculed as Efficient Exciton Harvesters", J. Phys. Chem. Lett 2014, 5, 2802-2807.
Marcus L. Bohm, et al., "Size and Energy Level Tuning of Quantum Dot Solids is a Hybrid Ligand Complex", J. Phys. Chem. Lett. 2015, 6, 3510-3514.
Mausam Kalita, et al., "Direct Synthesis of Aqueous Quantum Dots through 4,4'-Bipyridine-Based Twin Ligand Strategy", Inorg. Chem. 2012, 51, 4521-4526.
Wenjie Li, et al., "Capping Ligand-Induced Self-Assembly for Quantum Dot Sensitized Solar Cells", J. Phys. Chem. Lett 2015, 6, 796-806.
U.S. Non-Final Office Action dated Jan. 22, 2020 for U.S. Appl. No. 15/821,007 (see, List of references cited by examiner dated Jan. 22, 2020).

* cited by examiner

QUANTUM DOTS, A COMPOSITION OR COMPOSITE INCLUDING THE SAME, AND AN ELECTRONIC DEVICE INCLUDING THE SAME

CROSS-REFERENCE TO RELATED APPLICATION

This application claims priority to Korean Patent Applications Nos. 10-2016-0158704 and 10-2016-0174971, filed in the Korean Intellectual Property Office on Nov. 25, 2016 and Dec. 20, 2016, respectively, and all the benefits accruing therefrom under 35 U.S.C. § 119, the contents of which are both incorporated herein in their entirety by reference.

BACKGROUND

1. Field

Quantum dots, a composition or composite including the same, and a device including the same are disclosed.

2. Description of the Related Art

Quantum dots (e.g., nano-sized semiconductor nanocrystals) having different energy bandgaps may be obtained by controlling their sizes and compositions. Such quantum dots may emit light having various wavelengths. In a colloidal synthesis, organic materials such as a dispersing agent or a solvent may coordinate, e.g., be bound, to a surface of the semiconductor during the growth thereof. As a result, quantum dots having a uniformly controlled size and showing desirable luminous properties and stabilities may be prepared.

However, the luminous properties of the quantum dots are susceptible to the external environment. Thus, the quantum dots are mixed with (e.g., dispersed in) a solid state matrix (e.g., a polymer matrix) to form a quantum dot polymer composite, which is then applied to various electronic devices such as different display devices and lighting devices. The mixing of the quantum dot or the preparation processes of the device including the same may involve some processes such as a heat-treatment that may adversely affect the inherent luminous properties of the quantum dots. Thus, there remains a need to develop a technology for mixing a quantum dot into a medium or fabricating a device including the same without causing deterioration of inherent properties of the quantum dots.

SUMMARY

An embodiment is related to a composition for preparing a quantum dot polymer composite capable of achieving improved process stability and to a quantum dot polymer composite prepared therefrom.

An embodiment provides an electronic device including the quantum dot-polymer composite.

In an embodiment, a quantum dot includes a semiconductor nanocrystal particle, and a ligand bound to a surface of the semiconductor nanocrystal particle, wherein the ligand includes a first ligand including (or derived from) a compound represented by Chemical Formula 1 and a second ligand including (or derived from) a compound represented by Chemical Formula 2:

$$MA_n \quad \text{Chemical Formula 1}$$

wherein M is Mg, Ca, Sc, Sn, Ti, V, Cr, Mn, Fe, Co, Ni, Cu, Zn, Ga, Sr, Y, Zr, Nb, Mo, Cd, In, Ba, Au, Hg, or Tl, n is determined depending on the valency of the M and is an integer of greater than or equal to 2, each A is the same or different, and is independently a C1 to C10 organic group, a halogen, or a combination thereof.

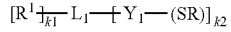

Chemical Formula 2 wherein, $R^1$ is hydrogen, a substituted or unsubstituted C1 to C40 (or C1 to C30) linear or branched alkyl group, a C2 to C40 (or C1 to C30) linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH₂, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a nitrogen atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C3 to C30 heterocycloalkylene group, a substituted or unsubstituted C6 to C30 arylene group, a substituted or unsubstituted C3 to C30 heteroarylene group, or a substituted or unsubstituted C2 to C30 alkylene group or a substituted or unsubstituted C3 to C30 alkenylene group having at least one methylene (—CH₂—) replaced with sulfonyl (—S(=O)₂—), carbonyl (—O(=O)—), ether (—O—), sulfide (—S—), sulfoxide (—S(=O)—), ester (—O(=O)O—), amide (—O(=O)NR—) (wherein R is hydrogen or a C1 to C10 alkyl group), or a combination thereof, $Y_1$ is a single bond, —O(=S)—, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH₂—) is replaced by sulfonyl (—S(=O)₂—), carbonyl (—O(=O)—), ether (—O—), sulfide (—S—), sulfoxide (—S(=O)—), ester (—O(=O)O—), amide (—O(=O)NR—) (wherein R is hydrogen or a C1 to C10 linear or branched alkyl group), imine (—NR—) (wherein R is hydrogen or a C1 to C10 linear or branched alkyl group), or a combination thereof, R is hydrogen or a monovalent metal (e.g., an alkali metal such as sodium);

k1 is 0 or an integer of 1 or more, k2 is 1 or 2 wherein when the k2 is 2, the $Y_1$ is a single bond and the two SR moieties are bonded to adjacent two carbon atoms in the $L_1$ moiety, respectively, and provided that a sum of k1 and k2 does not exceed the valence of $L_1$.

The semiconductor nanocrystal particle may include a Group II-VI compound, a Group III-V compound, a Group IV-VI compound, a Group IV element or compound, a Group I-III-VI compound, a Group I-II-IV-VI compound, or a combination thereof.

The semiconductor nanocrystal particle may include a core including a first semiconductor nanocrystal and a shell disposed on the core and including a second semiconductor nanocrystal.

The A of Chemical Formula 1 may include a C1 (e.g., C2) to C5 organic functional group The A of Chemical Formula 1 may include a C2 to C5 hydrocarbyl group, RCOO— or ROCO— (wherein R is a C1 to C4 hydrocarbyl group), a halogen (e.g., a chlorine, bromine, or iodine), or a combination thereof.

The first ligand may include a metal that is a metal that is the same as a metal present on the surface of the quantum dot.

The first ligand may include an organic metal salt, a halogenated metal, a hydrocarbyl metal, a hydrocarbyl metal halide, a metal (meth)acrylate, a metal dialkyldithiocarbamate, or a combination thereof.

The first ligand may include indium chloride, cadmium chloride, aluminum chloride, iron chloride, manganese chloride, diethyl zinc, dipropyl zinc, triethyl aluminum, tributyl aluminum, a zinc carboxylate (e.g., a zinc acetate, a zinc propionate, a zinc butyrate, or the like), a zinc (meth) acrylate, a zinc chloride, indium acetate, or a combination thereof.

The second ligand may include a compound represented by Chemical Formula 2-1, Chemical Formula 2-2, or Chemical Formula 2-3:

Chemical Formula 2-1

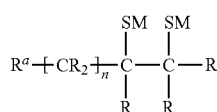

Chemical Formula 2-2

RRNCSSM            Chemical Formula 2-3 wherein $R^a$ includes a substituted or unsubstituted C1 to C24 alkyl group, a substituted or unsubstituted C2 to C24 alkenyl group, and a substituted or unsubstituted C6 to C20 aryl group, R is the same or different, and is each independently hydrogen or a substituted or unsubstituted C1 to C24 alkyl group, n is an integer of 0 to 15, L is a direct bond, a sulfonyl (—S(=O)$_2$—), carbonyl (—C(=O)—), ether group (—O—), sulfide group (—S—), sulfoxide group (—S (=O)—), ester group (—C(=O)O—), amide group (—C (=O)NR—) (wherein R is hydrogen or a C1 to C10 alkyl group), a substituted or a unsubstituted C1 to C10 alkylene, a C2 to C10 alkenylene, or a combination thereof, and M is hydrogen, lithium, sodium, potassium, or a combination thereof.

The second ligand may include a substituted or unsubstituted C1 to C40 alkyl thiol compound, a C2 to C40 mercapto carboxylic acid compound, a C2 to C40 mercapto carboxylic acid alkyl ester compound, a dithiocarbamate compound having a C1 to C40 alkyl group, or a combination thereof.

The second ligand may include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutyl mercaptoacetate, thioglycolic acid, 3-mercaptopropionic acid, thiopronine (sulfhydryl acylated derivative of glycine), 2-mercaptopropionic acid, 2-mercapto propionate, 2-mercaptoethanol, cysteamine, 1-thioglycerol, mercaptosuccinic acid, L-cysteine, dihydrolipoic acid, 2-(dimethylamino)ethanethiol, 5-mercaptomethyl tetrazole, 2,3-dimercapto-1-propanol glutathione, m(PEG)-SH, di(C1 to C30 alkyl)dithiocarbamic acid or a metal salt thereof (e.g., di(C1 to C30 alkyl)dithiocarbamate such as diethyldithiocarbamate), or a combination thereof.

The second ligand does not include carboxylic acid moiety.

The quantum dot may have a 5% weight loss temperature of less than or equal to about 400° C. as determined by a thermogravimetric analysis.

In some embodiments, a composition includes:

the aforementioned quantum dot (e.g., a plurality of the aforementioned quantum dots);

a binder polymer;

a polymerizable (e.g., photopolymerizable) monomer having a carbon-carbon double bond; and a photoinitiator.

The binder polymer may include a carboxylic acid group (—COOH).

The binder polymer includes a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group;

a multiple aromatic ring-containing polymer including a carboxylic acid group and having a backbone structure in a main chain, wherein the backbone structure includes a quaternary carbon atom, which is a part of a cyclic group, and two aromatic rings bound to the quaternary carbon atom; or a combination thereof.

The binder polymer may have an acid value of greater than or equal to about 50 milligrams of KOH per gram of the polymer.

The binder polymer may have an acid value of less than or equal to about 250 milligrams of KOH per gram of the polymer.

The copolymer may include a first repeating unit derived from the first monomer, a second repeating unit derived from the second monomer, and optionally a third repeating unit derived from the third monomer.

The first repeating unit may include a unit represented by Chemical Formula 3-1, a unit represented by Chemical Formula 3-2, or a combination thereof:

Chemical Formula 3-1

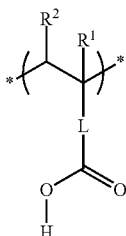

wherein
R¹ is hydrogen, a C1 to C3 alkyl group, or —(CH₂)ₙ—COOH (wherein n is 0 to 2),
R² is hydrogen, a C1 to C3 alkyl group, or —COOH,
L is a single bond, a divalent C1 to C15 aliphatic hydrocarbon group, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, and
* indicates a portion linked to an adjacent atom;

Chemical Formula 3-2

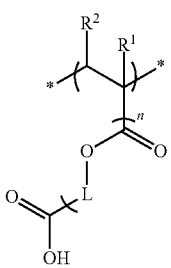

wherein
R¹ is hydrogen, a C1 to C3 alkyl group, or —(CH₂)ₙ—COOH (wherein n is 0 to 2),
R² is hydrogen or a C1 to C3 alkyl group,
L is a divalent C1 to C15 alkylene group, a divalent C1 to C15 alkylene group wherein at least one methylene group is substituted with —C(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
n is an integer of 1 to 3, and
* indicates a portion linked to an adjacent atom.

The second repeating unit may include a unit represented by Chemical Formula 4-1, a unit represented by Chemical Formula 4-2, a unit represented by Chemical Formula 4-3, a unit represented by Chemical Formula 4-4, or a combination thereof:

Chemical Formula 4-1

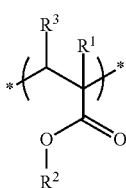

wherein
R¹ is hydrogen or a C1 to C3 alkyl group,
R² is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
R³ is hydrogen or a C1 to C3 alkyl group, and
* indicates a portion linked to an adjacent atom;

Chemical Formula 4-2

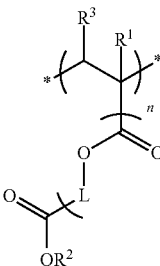

wherein
R¹ is hydrogen or a C1 to C3 alkyl group,
L is a divalent C1 to C15 alkylene group, a divalent C1 to C15 alkylene group wherein at least one methylene group is substituted with —O(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
R² is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
R³ is hydrogen or a C1 to C3 alkyl group,
n is an integer of 1 to 3, and
* indicates a portion linked to an adjacent atom;

Chemical Formula 4-3

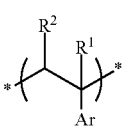

wherein
each of R¹ and R² is independently hydrogen or a C1 to C3 alkyl group,
Ar is a substituted or unsubstituted C6 to C30 aromatic hydrocarbon group or a substituted or unsubstituted C3 to C30 alicyclic hydrocarbon group, and
* indicates a portion linked to an adjacent atom;

Chemical Formula 4-4

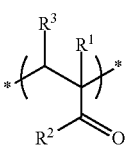

wherein

R¹ is hydrogen or a C1 to C3 alkyl group,

R² is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, R³ is hydrogen or a C1 to C3 alkyl group, and

* indicates a portion linked to an adjacent atom.

The third repeating unit may be represented by Chemical Formula 5:

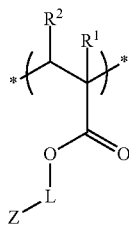

Chemical Formula 5 wherein each of R¹ and R² is independently hydrogen or a C1 to C3 alkyl group,

L is a divalent C1 to C15 alkylene group, a divalent C1 to C15 alkylene group wherein at least one methylene group is substituted with —C(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion linked to an adjacent atom.

The multiple aromatic ring-containing polymer may include the backbone structure including a unit represented by Chemical Formula A:

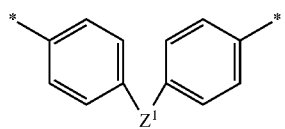

Chemical Formula A wherein

* indicates a portion that is linked to an adjacent atom of the main chain of the binder, Z¹ is a linking moiety represented by any one of Chemical Formulae A-1 to A-6, and in Chemical Formulae A-1 to A-6, * indicates a portion that is linked to the aromatic ring:

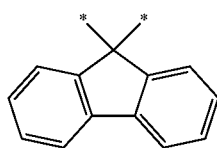

Chemical Formula A-1

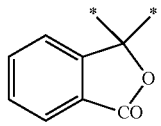

Chemical Formula A-2

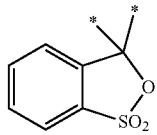

Chemical Formula A-3

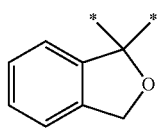

Chemical Formula A-4

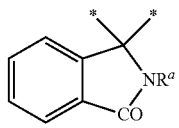

Chemical Formula A-5 wherein $R^a$ is hydrogen, an ethyl group, $C_2H_4Cl$, $C_2H_4OH$, $CH_2CH=CH_2$, or a phenyl group,

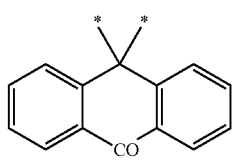

Chemical Formula A-6

The composition may further include a thiol compound that is represented by Chemical Formula 6 and having a thiol group at its end terminals:

$$[R^1\text{---}_{k1}L_1\text{---}(Y_1\text{---}(SH)_m]_{k1}$$

Chemical Formula 6 wherein,

R¹ is hydrogen, a substituted or unsubstituted C1 to C30 linear or branched alkyl group, a C2 to C30 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C3 to C30 heterocycloalkyl group, a C1 to C10 alkoxy group, a hydroxy group, —NH₂, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, or a substituted or unsubstituted C2 to C30 alkylene group or a substituted or unsubstituted C3 to C30 alkenylene group, having at least one methylene (—CH$_2$—) replaced by sulfonyl (—S(=O)$_2$—), carbonyl (—O(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH$_2$—) is replaced by sulfonyl (—S(=O)$_2$—), carbonyl (—O(=O)—), ether (—O—), sulfide (—S—), sulfoxide (—S(=O)—), ester (—O(=O)O—), amide (—O(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that m does not exceed the valence of $Y_1$ when $Y_1$ is not a single bond, and provided that a sum of k1 and k2 does not exceed the valence of $L_1$.

The thiol compound may include ethoxylated pentaerythritol tetra(3-mercaptopropionate), trimethylolpropane tri(3-mercaptopropionate), trimethylolpropane-tri(2-mercaptoacetate), glycol di-3-mercaptopropionate, polypropylene glycol di(3-mercaptopropionate), ethoxylated trimethylolpropane tri(3-mercaptopropionate), glycol dimercaptoacetate, ethoxylated glycol dimercaptoacetate, 1,4-bis(3-mercaptobutyryloxy)butane, tris[2-(3-mercaptopropionyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof.

The polymerizable monomer including a carbon-carbon double bond may include a monomer having at least one (meth)acrylate moiety.

The composition may include a plurality of the quantum dots and a solvent. The composition may include, based on the total weight of the composition:

about 1 weight percent to about 60 weight percent of the quantum dots;

about 0.5 weight percent to about 60 weight percent of the binder polymer;

about 0.5 weight percent to about 70 weight percent of the polymerizable monomer;

optionally, less than or equal to about 50 weight percent of a multi-thiol compound; and about 0.01 weight percent to about 10 weight percent of the photoinitiator; and a balance amount of the solvent.

A viscosity increase of the composition may be less than 10% with respect to an initial viscosity thereof when the composition is left at 4° C. for 144 hours.

In some embodiments, a layered structure includes a substrate (e.g., a transparent substrate); and a photoluminescent layer disposed on the substrate and including a pattern of a quantum dot polymer composite, wherein the quantum dot polymer composite includes a polymer matrix and a plurality of quantum dots dispersed in the polymer matrix, the plurality of quantum dots includes the aforementioned quantum dot, the pattern of the quantum dot polymer composite includes at least one repeating section selected from a first section emitting a first light, a second section emitting a second light, and a combination thereof.

The polymer matrix may include a crosslinked polymer and a polymer including a carboxylic acid group.

The crosslinked polymer may include a thiol-ene polymer, a crosslinked poly(meth)acrylate, or a combination thereof.

In embodiments, a method of producing the aforementioned layered structure includes:

forming a film of the aforementioned composition on the substrate;

exposing a selected area of the film to light (e.g., having a wavelength of less than or equal to about 400 nanometers (nm)); and developing the exposed selected area of the film with an alkaline developer (e.g., an aqueous alkaline solution) to obtain the pattern of the quantum dot polymer composite.

In embodiments, a liquid crystal display includes a backlight unit including a light source to provide a third light, a lower substrate disposed on (or over) the backlight unit; the aforementioned layered structure; and a liquid crystal layer interposed between the lower substrate and the layered structure, wherein the layered structure is disposed such that the photoluminescent layer faces the liquid crystal layer.

In embodiments, a quantum dot polymer composite includes a polymer matrix and a plurality of quantum dots dispersed in the polymer matrix, wherein the plurality of quantum dots includes the aforementioned quantum dot.

The polymer matrix may include a thiol-ene polymer, a (meth)acrylate polymer, a urethane polymer, an epoxy polymer, a vinyl polymer, a silicone polymer, or a combination thereof.

In embodiments, an electronic device includes the aforementioned quantum dot polymer composite.

The electronic devices may include a light emitting diode (LED), an organic light emitting diode (OLED), a sensor, an imaging sensor, a solar cell, or a liquid crystal display device.

The quantum dot of the embodiments may have increased light emitting efficiency together with enhanced stability. A composition including the quantum dot of the embodiments may provide improved processability.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
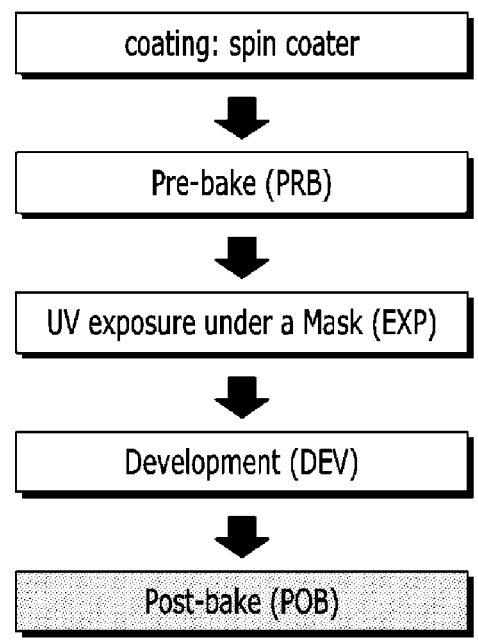
FIG. 1 is a schematic diagram illustrating an exemplary embodiment of a method of producing a quantum dot polymer composite pattern.
Figure 1:
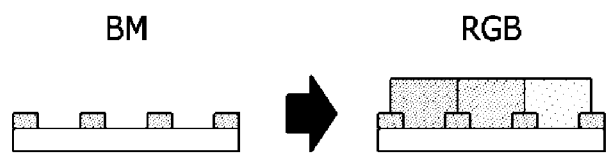

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

Accordingly, the embodiments are merely described below, by referring to the figures, to explain aspects of the present description. As used herein, the term "and/or" includes any and all combinations of one or more of the associated listed items. The term "or" means "and/or." Expressions such as "at least one of" when preceding a list of elements, modify the entire list of elements and do not modify the individual elements of the list.

It will be understood that when an element is referred to as being "on" another element, it may be directly on the other element or intervening elements may be present therebetween. In contrast, when an element is referred to as being "directly on" another element, there are no intervening elements present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Combination" as used herein is inclusive of all types of combinations, including blends, alloys, solutions, and the like.

In the drawings, the thickness of layers, films, panels, regions, etc., are exaggerated for clarity. Like reference numerals designate like elements throughout the specification.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, when a definition is not otherwise provided, the term "substituted" refers to a compound or a group or a moiety wherein at least one of hydrogen atoms thereof is substituted with a substituent including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxylic acid group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO₃MH or —PO₃M₂, wherein M is an organic or inorganic cation), or a combination thereof.

As used herein, when a definition is not otherwise provided, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of at least one (e.g., one to three) heteroatom(s) including N, O, S, Si, or P.

As used herein, when a definition is not otherwise provided, the term "alkylene group" refers to a straight or branched saturated aliphatic hydrocarbon group having a valence of at least two, optionally substituted with one or more substituents. As used herein, when a definition is not otherwise provided, the term "arylene group" refers to a functional group having a valence of at least two obtained by removal of at least two hydrogens in an aromatic ring, optionally substituted with one or more substituents.

As used herein, when a definition is not otherwise provided, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, and a C3 to C30 cycloalkynyl group.

As used herein, when a definition is not otherwise provided, the term "(meth)acrylate" refers to acrylate and/or methacrylate.

As used herein, when a definition is not otherwise provided, the term "dispersion" refers to a dispersion, wherein a dispersed phase is a solid and a continuous phase includes a liquid. For example, the term "dispersion" may refer to a colloidal dispersion wherein the dissolved or dispersed phase has a dimension of about 1 nm to about several micrometers (μm) (e.g., 1 μm or less, 2 μm or less, or 3 μm or less).

As used herein, when a definition is not otherwise provided, the term "Group" in the term Group III, Group II, and the like refers to a group of Periodic Table.

As used herein, when a definition is not otherwise provided, "Group III" refers to Group IIIA and Group IIIB, and examples of Group III metal may be Al, In, Ga, and Tl, but are not limited thereto.

As used herein, when a definition is not otherwise provided, "Group IV" refers to Group IVA and Group IVB, and examples of a Group IV metal may be Si, Ge, and Sn, but are not limited thereto. As used herein, the term "metal" may include a semi-metal such as Si.

As used herein, when a definition is not otherwise provided, "Group I" refers to Group IA and Group IB, and examples may include Li, Na, K, Rb, and Cs, but are not limited thereto.

As used herein, when a definition is not otherwise provided, "Group V" refers to Group VA, and examples may include N, P, As, Sb, and Bi, but are not limited thereto.

As used herein, when a definition is not otherwise provided, "Group VI" refers to Group VIA, and examples may include S, Se, and Te, but are not limited thereto.

As used herein, when a definition is not otherwise provided, the term "carboxylic acid group (—COOH) containing polymer" refers to a polymer having a repeating unit with a carboxylic acid group.

In an embodiment, a quantum dot includes a semiconductor nanocrystal particle and a ligand (e.g., bound to a surface thereof). The ligand includes a first ligand and a second ligand. The first ligand and the second ligand include (or are derived from) a polyvalent metal compound and a thiol compound (e.g., a thiol and a thiolate), respectively. The polyvalent metal compound may be present as a moiety (e.g., as a metal cation and its counter ion) derived therefrom. The thiol compound may be bound to a surface of the quantum dot in the form of a moiety derived from the thiol compound. The semiconductor nanocrystal particle may include a core including a first semiconductor nanocrystal and a shell being disposed on the core and including a second semiconductor nanocrystal. The second semiconductor nanocrystal may include a different composition from that of the first semiconductor nanocrystal.

Types of the semiconductor nanocrystal particle are not particularly limited. The semiconductor nanocrystal particle may be prepared by any known method or is a commercially available. For example, the semiconductor nanocrystal particle (e.g., the first semiconductor nanocrystal and/or the second semiconductor nanocrystal) may include a Group II-VI compound, a Group III-V compound, a Group IV-VI compound, a Group IV element or compound, a Group I-III-VI compound, a Group I-II-IV-VI compound, or a combination thereof. In some embodiments, the quantum dot or the semiconductor nanocrystal particle does not include cadmium, lead, mercury, or a combination thereof The Group II-VI compound may include:
a binary element compound including CdSe, CdTe, ZnS, ZnSe, ZnTe, ZnO, HgS, HgSe, HgTe, MgSe, MgS, or a combination thereof;
a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and
a quaternary element compound including ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof.

The Group II-VI compound may further include a Group III metal.

The Group III-V compound may include:
a binary element compound including GaN, GaP, GaAs, GaSb, AlN, AlP, AlAs, AlSb, InN, InP, InAs, InSb, or a combination thereof;
a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and
a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group III-V compound may further include a Group II metal (e.g., InZnP).

The Group IV-VI compound may include:
a binary element compound including SnS, SnSe, SnTe, PbS, PbSe, PbTe, or a combination thereof;
a ternary element compound including SnSeS, SnSeTe, SnSTe, PbSeS, PbSeTe, PbSTe, SnPbS, SnPbSe, SnPbTe, or a combination thereof; and
a quaternary element compound including SnPbSSe, SnPbSeTe, SnPbSTe, or a combination thereof.

Examples of the Group I-III-VI compound may include CuInSe$_2$, CuInS$_2$, CuInGaSe, and CuInGaS, but are not limited thereto.

Examples of the Group I-II-IV-VI compound may include CuZnSnSe and CuZnSnS, but are not limited thereto.

The Group IV element or compound may include:

a single-elementary substance including Si, Ge, or a combination thereof; and a binary element compound including SiC, SiGe, or a combination thereof.

The binary element compound, the ternary element compound, or the quaternary element compound may be respectively included in a uniform concentration in the particle or partially different concentrations in the same particle. The semiconductor nanocrystal particle may include a core including a first semiconductor nanocrystal and a shell disposed on at least a portion (or the entire) of a surface of the core and including a second semiconductor nanocrystal having a different composition from that of the first semiconductor nanocrystal. At the interface between the core and the shell, an alloyed interlayer may be present or may not be present. The alloyed layer may include a homogeneous alloy. The alloyed layer may have a concentration gradient. In the gradient alloy, the concentration of an element of the shell radially changes (e.g., decreases or increases toward the core). In addition, the shell may include a multi-layered shell having at least two layers wherein adjacent layers have different composition each other. In the multi-layered shell, each layer may have a single composition. In the multi-layered shell, each layer may have an alloy. In the multi-layered shell, each layer may have a concentration gradient that changes radially in light of a composition of a semiconductor nanocrystal.

In the core-shell semiconductor nanocrystal particle, the materials of the shell may have a bandgap energy that is larger than that of the core, but it is not limited thereto. The materials of the shell may have a bandgap energy that is smaller than that of the core. In the case of the multi-layered shell, the energy bandgap of the outermost layer material of the shell may be greater than those of the core and the inner layer material of the shell (a layer that is closer to the core). In the case of the multi-layered shell, a semiconductor nanocrystal of each layer is selected to have an appropriate bandgap energy, thereby effectively showing a quantum confinement effect.

The semiconductor nanocrystal particle may have a size (e.g., particle diameter or in the case of a non-spherically shaped particle, a diameter calculated from a two dimensional area of an electron microscopic image of the particle) of about 1 nm to about 100 nm. In some embodiments, the quantum dot may have a particle diameter of about 1 nm to about 50 nm, for example, from 2 nm (or from 3 nm) to 35 nm. In some embodiments, the quantum dot have a diameter of greater than or equal to about 1 nm, greater than or equal to about 2 nm, greater than or equal to about 3 nm, greater than or equal to about 4 nm, or greater than or equal to about 5 nm. In some embodiments, the quantum dot have a diameter of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

The semiconductor nanocrystal particle may have a generally-used shape in the art, and is not particularly limited. For example, the quantum dot may include spherical, pyramidal, multi-armed, or cubic nanoparticles, nanotubes, nanowires, nanofibers, nanoplate particles, a combination thereof, or the like.

The semiconductor nanocrystal particle may be commercially available or may be synthesized in any method. For example, several nano-sized quantum dots may be synthesized by a wet chemical process. In the wet chemical process, precursors react in an organic solvent to grow nanocrystal particles, and the organic solvent or a ligand compound may coordinate (or be bound) to the surface of the semiconductor nanocrystal, thereby controlling the growth of the nanocrystal. Examples of the organic solvent and ligand compound are known.

The quantum dot as prepared may be recovered by pouring an excess amount of a non-solvent to a reaction solution including the quantum dot and centrifuging the resulting mixture. Examples of the non-solvent include acetone, ethanol, methanol, and the like, but are not limited thereto.

The quantum dot prepared by the wet chemical method may have an organic ligand bonded to a surface thereof. In an embodiment, the organic ligand may include RCOOH, RNH$_2$, R$_2$NH, R$_3$N, R$_3$PO, R$_3$P, ROH, RCOOR', RPO(OH)$_2$, R$_2$POOH (wherein R and R' are the same or different, and are independently a C1 to C40 aliphatic hydrocarbon such as C1 to C40 or C5 to C24 alkyl group or a C1 to C40 or C5 to C24 alkenyl group or a C6 to C40 aromatic hydrocarbon such as a C5 to C20 aryl group), a polymeric organic ligand, or a combination thereof.

Examples of the organic ligand compound may include:

amine compounds such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine;

carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid;

phosphine compounds such as methyl phosphine, ethyl phosphine, propyl phosphine, butyl phosphine, pentyl phosphine, octyl phosphine, dioctyl phosphine, tributyl phosphine, or trioctyl phosphine;

phosphine oxide compounds such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide;

diphenyl phosphine, triphenyl phosphine, or oxide compounds thereof;

a C5 to C20 alkylphosphinic acid such as hexylphosphinic acid, octylphosphinic acid, dodecylphosphinic acid, tetradecylphosphinic acid, hexadecylphosphinic acid, or octadecylphosphinic acid;

and the like, but are not limited thereto.

In some embodiments, the quantum dot may further include at least one organic ligand selected from the foregoing.

The light emitting wavelength of the semiconductor nanocrystal particle or the quantum dot is not particularly limited and may be selected appropriately. The photoluminescent wavelength of the semiconductor nanocrystal may be present in a range from a ultraviolet region to a near infrared region. For example, the maximum peak wavelength of the semiconductor nanocrystal may be present within a range from about 420 to about 750 nm, but it is not limited thereto. The semiconductor nanocrystal may have a quantum yield (or a quantum efficiency) of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%.

The semiconductor nanocrystal may have a full width half maximum (FWHM) of less than or equal to about 45 nm, for example less than or equal to about 40 nm, or less than or equal to about 30 nm. While not wishing to be bound by theory, it is understood that within such ranges, a device including the nanocrystal may have enhanced color purity or improved color reproducibility.

In order for the quantum dots to be used in a device, they may be mixed with an organic and/or inorganic matrix. Such mixing and/or fabrication process for a device may cause serious deterioration in luminous properties the quantum dots originally have. For example, a mixing with polymer and/or a heat/photo treatment for a preparation of a quantum dot polymer composite may lead to a decrease in a luminous efficiency. Without wishing to be bound by any theory, the mixing and/or the treatment may cause a loss of ligands present on a surface of the quantum dot and this may cause deterioration of properties.

Quantum dots having unique luminous properties have great potential to be applied in various devices (e.g., electronic devices). Currently, most of quantum dots having properties that can be used in an electronic device are cadmium-based quantum dots. However, cadmium poses serious threats to health and environment and is a restricted element. A Group III-V based quantum dot is a type of a cadmium free quantum dot. However, the stability (e.g., chemical stability, heat stability, and/or photostability) of a cadmium free quantum dot (such as a Group III-V based quantum dot or a quantum dot having a Group III-V core) may be inferior to the cadmium based quantum dots. Thus, in various processes for the application into the electronic device, the luminous properties of the cadmium free quantum dots may significantly deteriorate.

To prevent or suppress the deterioration of the quantum dot properties, passivation with an organic compound or an organic/inorganic hybrid compound may be used. However, complex processes may be required and/or the passivation may be considerably hampered by the steric hindrance due to the moieties of the organic compound and the organic/inorganic hybrid compound and thus cannot provide sufficient protection for the quantum dot surface.

In the case of the quantum dot of the embodiments, a surface exchange reaction may be carried out under a relatively simple and mild condition for a relatively short period of time and thereby the first ligand including (or being derived therefrom) a polyvalent metal compound and the second ligand including a monothiol or a cis-type dithiol or a thiolate thereof may bound to a surface of the quantum dot. The quantum dot thus prepared may show improved stability (e.g., chemical stability and heat stability).

The polyvalent metal compound may include a metal halide and/or an organic metal compound having a relatively short organic functional group. In some embodiments, the first ligand may include a compound represented by Chemical Formula 1:

$$MA_n \quad \text{Chemical Formula 1}$$

wherein M is Mg, Ca, Sc, Sn, Ti, V, Cr, Mn, Fe, Co, Ni, Cu, Zn, Ga, Sr, Y, Zr, Nb, Mo, Cd, In, Ba, Au, Hg, or Tl, n is determined depending on the valency of the M and is an integer of greater than or equal to 2, each A is the same or different, and is independently a C1 to C10 organic group, a halogen (such as F, Cl, Br or I), or a combination thereof.

In some embodiments, the first ligand may include a metal that is the same as the metal present on a surface of the quantum dot. For example, when the outermost layer of the quantum dot includes zinc, the M of Chemical Formula 1 is zinc.

In some embodiments, the A of Chemical Formula 1 may include an organic functional group having 2 to 5 carbon atoms or a halogen containing group. The A of Chemical Formula 1 may include a C2 to C5 hydrocarbyl group, RCOO— or ROCO— (wherein R is a C1 to C4 hydrocarbyl group), a halogen (e.g., fluorine, chlorine, bromine, or iodine), or a combination thereof.

In some embodiments, the first ligand may include an organic metal salt (e.g., a metal acetate, a metal propionate, a metal butyrate, a metal (meth)acrylate, and the like), a halogenated metal such as a metal chloride, a metal bromide, or a metal iodide, a hydrocarbyl metal such as an alkylated metal or an arylated metal, a hydrocarbyl metal halide, or a combination thereof. In some embodiments, the first ligand may include a metal chloride such as zinc chloride, indium chloride, cadmium chloride, aluminum chloride, iron chloride, or a manganese chloride; an alkylated metal such as diethyl zinc, dipropyl zinc, dibutyl zinc, triethyl aluminum, tributyl aluminum, or the like; a metal (zinc or indium) carboxylate such as zinc acetate, zinc acrylate, indium acetate, or the like; or a combination thereof. In some embodiments, the first ligand may include a zinc acetate, zinc propionate, zinc butylate, zinc (meth)acrylate, zinc chloride, or a combination thereof.

When being used in a quantum dot passivation process, an organic metal ligand having a carbon number greater than or equal to 11 may not provide sufficient passivation due to the steric hindrance of the organic moiety. A metal ligand having a relatively short carbon chain may efficiently passivate a surface of the quantum dot, thereby increasing the luminous efficiency of the quantum dot. However, the quantum dot passivated by the metal ligand only or the quantum dot passivated by the metal ligand having a carbon number of greater than or equal to 11 may cause a sharp increase in a composition viscosity or may bring about a gelation of the composition, thus cannot provide a processability necessary for the fabrication of the device. The quantum dot of the embodiments includes the thiol-based second ligand that is bound to a surface thereof together with the first ligand, making it possible to realize enhanced luminous properties and desired processability at the same time.

The second ligand may include a monothiol or monothiolate having one thiol group. The second ligand may include a dithiol or a derivative thereof, wherein two thiol groups are bonded to adjacent two carbon atoms (i.e., disposed in a cis type configuration), respectively. In some embodiments, the second ligand does not include a carboxylic acid moiety.

In some embodiments, the second ligand may include a compound represented by Chemical Formula 2:

$$[R^1 \frac{}{k1} L_1 \frac{}{} Y_1 - (SR)]_{k2} \quad \text{Chemical Formula 2}$$

wherein,

R¹ is hydrogen, a substituted or unsubstituted C1 to C40 (or C1 to C30) linear or branched alkyl group, a C2 to C40 (C1 to C30) linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH₂, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), C(=O)ONRR' (wherein R and R' are the same or different, and are independently hydrogen or a C1 to C20 linear or branched alkyl group) or a combination thereof, $L_1$ is a carbon atom, a nitrogen atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C3 to C30 heterocycloalkylene group, a substituted or unsubstituted C6 to C30 arylene group, a substituted or unsubstituted C3 to C30 heteroarylene group, or a substituted or unsubstituted C2 to C30 alkylene group or a substituted or unsubstituted C3 to C30 alkenylene group, having at least one methylene (—CH₂—) replaced with sulfonyl (—S(=O)₂—), carbonyl (—O(=O)—), ether (—O—), sulfide (—S—), sulfoxide (—S(=O)—), ester (—O(=O)O—), amide (—O(=O)NR—) (wherein R is hydrogen or a C1 to C10 alkyl group), or a combination thereof, $Y_1$ is a single bond, —O(=S)—, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—CH₂—) is replaced by sulfonyl (—S(=O)₂—), carbonyl (—O(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, R is hydrogen or a monovalent metal (e.g., an alkali metal such as lithium, sodium, potassium, or the like);

k1 is 0 or an integer of 1 or more, k2 is 1 or 2 provided that when k2 is 2, $Y_1$ is a single bond and the two SR moieties are bonded to adjacent two carbon atoms in the $L_1$ moiety, respectively, and provided that the sum of k1 and k2 does not exceed the valence of $L_1$.

The second ligand may include a substituted or unsubstituted C1 to C40 (e.g., C4 to C12) alkyl thiol compound, a substituted or unsubstituted C2 to C40 mercapto carboxylic acid compound, a substituted or unsubstituted C2 to C40 mercapto carboxylic acid alkyl ester compound, a dithiocarbamic acid compound having a C1 to C40 (e.g., C2 to C12) alkyl group or a metal salt thereof (e.g., dialkyldithiolcarbamate such as diethyldithiocarbamate), or a combination thereof. The second ligand may include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutyl mercaptoacetate, thioglycolic acid, 3-mercaptopropionic acid, thiopronine, 2-mercaptopropionic acid, 2-mercapto propionate, 2-mercaptoethanol, cysteamine, 1-thioglycerol, mercaptosuccinic acid, L-cysteine, dihydrolipoic acid, 2-(dimethylamino)ethanethiol, 5-mercaptomethyl tetrazole, 2,3-dimercapto-1-propanol glutathione, m(PEG)-SH, dialkyl(e.g., diethyl)dithiocarbamic acid or a metal salt thereof (e.g., dialkyldithiocarbamate), or a combination thereof.

The second ligand may include a compound represented by Chemical Formula 2-1, Chemical Formula 2-2, or Chemical Formula 2-3:

  Chemical Formula 2-1

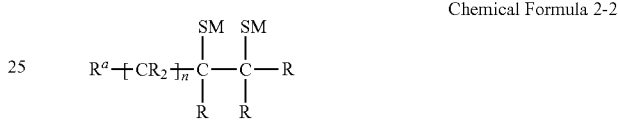  Chemical Formula 2-2

  Chemical Formula 2-3 wherein $R^a$ includes a substituted or unsubstituted C1 to C24 alkyl group, a substituted or unsubstituted C2 to C24 alkenyl group, and a substituted or unsubstituted C5 to C20 aryl group, R is the same or different, and is each independently hydrogen or a substituted or unsubstituted C1 to C24 alkyl group, n is an integer of 0 to 15, L is a direct bond, a sulfonyl (—S(=O)₂—), carbonyl (—C(=O)—), ether group (—O—), sulfide group (—S—), sulfoxide group (—S(=O)—), ester group (—C(=O)O—), amide group (—C(=O)NR—) (wherein R is hydrogen or a C1 to C10 alkyl group), a substituted or a unsubstituted C1 to C10 alkylene, a substituted or a unsubstituted C2 to C10 alkenylene, or a combination thereof, and M is hydrogen, lithium, sodium, potassium, or a combination thereof.

In some embodiments, $R^a$ of Chemical Formula 2-1 may include a C1 to C24 alkyl or C2 to C24 alkenyl group substituted with an alkoxy group (e.g., methoxy, ethoxy, or propoxy), a hydroxyl group, or a combination thereof. In some embodiments, L of Chemical Formula 2-1 may be a substituted or unsubstituted C2 to C10 alkylene or a substituted or unsubstituted C3 to C10 alkenylene wherein at least one methylene group may be replaced by a sulfonyl (—S(=O)₂—), carbonyl (—C(=O)—), ether group (—O—), sulfide group (—S—), sulfoxide group (—S(=O)—), ester group (—C(=O)O—), amide group (—C(=O)NR—) (wherein R is hydrogen or a C1 to C10 alkyl group), or a combination thereof.

The ratio between the first ligand and the second ligand may be controlled to provide effective passivation. In some embodiments, per one mole of the first ligand, the amount of the second ligand may be greater than or equal to about 0.1 moles and less than or equal to about 10 moles, but it is not limited thereto. In some embodiments, the second ligand may be present in an amount greater than that of the first ligand. In some embodiments, the quantum dot having the first and the second ligands may provide a composition having a reduced and suitable viscosity (e.g., when it is mixed with a polymer and/or a monomer). In addition, in the case of the composition including the quantum dots of the embodiments, an increase in the viscosity over time may be suppressed.

In some embodiments, an amount of the first ligand based on the polyvalent metal compound may be from about 10 wt % to about 90 wt %, for example, from about 10 wt % to 50 wt % or from about 15 wt % to about 45 wt %, with respect to a total of the first and the second ligands. An amount of the second ligand based on the thiol compound may be from about 90 wt % to about 10 wt %, for example, from about 10 wt % to 50 wt % or from about 15 wt % to about 45 wt %, with respect to a total of the first and the second ligands.

In the case of the quantum dot of some embodiments, the first and the second ligands may efficiently (e.g., more densely) passivate more sites on a surface of the quantum dot. Without wishing to be bound by any theory, each of the first ligand and the second ligand may bind the non-metal element (e.g., sulfur, selenium, or the like) and the metal element (e.g., zinc), respectively, and thus more sites present on the surface of the quantum dot may be passivated thereby. In addition, the first ligand and the second ligand may interact with each other, making it possible to carry out passivation under a minimized steric hindrance. In addition, the surface exchanged quantum dots of the embodiments may show improved compatibility with respect to more types of mediums and thus may be dispersed therein while deterioration of the efficiency may be inhibited, providing improved processability.

Therefore, in some embodiments, the first ligand and the second ligand may sufficiently passivate the surface of the quantum dot, providing enhanced optical properties by removal of surface defects. In addition, the first ligand and the second ligand may be stably bound to the surface of the quantum dot and thus the stability of the luminous properties of the quantum dots (e.g., the chemical stability and the thermal stability) may be improved. Accordingly, it may be possible to suppress a decrease in the efficiency that may occur otherwise when the quantum dots are mixed with a matrix medium or subjected to the heat treatment during the fabrication process of a device including the same. Due to the passivation achieved by the embodiments, the quantum dot may have a 5% weight loss temperature (that is, the temperature at which 5% of the weight of the quantum dot is lost) of less than or equal to about 400° C., for example, less than or equal to about 390° C., less than or equal to about 380° C., less than or equal to about 370° C., less than or equal to about 360° C., less than or equal to about 350° C., less than or equal to about 340° C., less than or equal to about 330° C., less than or equal to about 320° C., less than or equal to about 310° C., less than or equal to about 300° C., less than or equal to about 290° C. or less than or equal to about 280° C. as determined by a thermogravimetric analysis.

The quantum dot of the embodiments may include a greater or lesser amount of organics as determined by the thermogravimetric analysis of the quantum dot than the quantum dot prepared in the conventional manners. In general, the quantum dots prepared by a conventional wet chemical process may have organic materials in an amount of 15 wt % to 20 wt %. For example, however, as determined by the thermogravimetric analysis, the quantum dots of the embodiments may include organic materials in an amount of greater than or equal to about 25 percent by weight (wt %), for example, greater than or equal to about 26 wt %, greater than or equal to about 27 wt %, greater than or equal to about 28 wt %, or greater than or equal to about 29 wt %. The quantum dots of the embodiments may include organic materials in an amount of less than or equal to about 15 percent by weight (wt %), for example, less than or equal to about 14 wt % or less than or equal to about 13 wt %, as determined by the thermogravimetric analysis. In some embodiments, the quantum dots of the embodiments may include organic materials in an amount of greater than or equal to about 0.1 wt %, for example, greater than or equal to about 1 wt %, greater than or equal to about 2 wt %, greater than or equal to about 3 wt %, greater than or equal to about 4 wt %, or greater than or equal to about 5 wt %.

The quantum dots of the embodiments may be prepared by obtaining a colloidal quantum dot with an organic ligand coordinating to a surface thereof (e.g., prepared by the wet chemical method) and carrying out a surface exchange with a compound for the first ligand and a compound for the second ligand. In some embodiments, the surface exchange reaction may be carried out under relatively simple and mild conditions in terms of a temperature and a reaction time.

In some embodiments, the surface exchange may be carried out by contacting the quantum dot with the compound for the first ligand (e.g., the polyvalent metal compound represented by Chemical Formula 1) and the compound for the second ligand (e.g., the thiol compound represented by Chemical Formula 2) in an organic solvent under predetermined conditions.

The organic solvent may include a halogenated (e.g., chlorinated) hydrocarbon (e.g., chloroform, dichloroethane, or the like), a substituted or unsubstituted C6 to C40 aromatic hydrocarbon such as toluene, xylene, or the like, a substituted or unsubstituted C3 (or C6) to C40 cycloaliphatic hydrocarbon such as cyclohexane, a cyclohexyl acetate, or the like, a C1 to C10 alcohol such as ethanol, or a combination thereof.

Details for the quantum dots, the polyvalent metal compound, and the thiol compound are the same as set forth above. The conditions of the surface exchange are not particularly limited and may be selected appropriately depending on the types of the quantum dots, the first ligand, and the second ligand. In some embodiments, the temperature of the surface exchange may be less than or equal to about 90° C., less than or equal to about 80° C., less than or equal to about 70° C., or even less than or equal to about 65° C. In some embodiments, the surface exchange of the quantum dots may be performed at a relatively low temperature and thus it may be possible to provide a surface exchanged quantum dot without having an adverse effect on the luminous properties of the quantum dots. In some embodiments, the surface exchange temperature may be greater than or equal to room temperature, for example, greater than or equal to about 30° C., greater than or equal to about 40° C., or greater than or equal to about 50° C. For example, the temperature of the surface exchange may be from about 40° C. to about 70° C. The surface exchange may be carried out for greater than or equal to about 10 minutes, for example, greater than or equal to about 20 minutes, greater than or equal to about 30 minutes, greater than or equal to about 40 minutes, or greater than or equal to about 50 minutes.

The concentration of the quantum dots in the organic solvent may be selected appropriately and is not particularly limited. For example, the amount of the quantum dots may be greater than or equal to about 0.001 grams (g), for example, greater than or equal to about 0.1 g or greater than or equal to about 0.5 g per 1 milliliter (mL) of the organic solvent. The amount of the quantum dot may be less than or equal to about 3 g, for example, less than or equal to about 2 g or less than or equal to about 1 g per 1 mL of the organic solvent.

With respect to the amount of the quantum dot, the amount of the polyvalent metal compound may be greater than or equal to about 5 mol eq., (i.e., 5 molecules of the compound per one quantum dot), for example, greater than or equal to about 10 mol eq., greater than or equal to about 15 mol eq., greater than or equal to about 20 mol eq., greater than or equal to about 30 mol eq., greater than or equal to about 40 mol eq., greater than or equal to about 50 mol eq., greater than or equal to about 60 mol eq., greater than or equal to about 70 mol eq., greater than or equal to about 80 mol eq., greater than or equal to about 90 mol eq., or greater than or equal to about 100 mol eq., but it is not limited thereto. With respect to the amount of the quantum dot, the amount of the polyvalent metal compound may be less than or equal to about 1500 mol eq., for example, less than or equal to about 1000 mol eq., less than or equal to about 900 mol eq., less than or equal to about 800 mol eq., less than or equal to about 700 mol eq., less than or equal to about 600 mol eq., less than or equal to about 500 mol eq., less than or equal to about 400 mol eq., less than or equal to about 300 mol eq., or less than or equal to about 250 mol eq., but it is not limited thereto.

With respect to the amount of the quantum dot, the amount of the thiol may be greater than or equal to about 20 mol eq., for example, greater than or equal to about 40 mol eq., greater than or equal to about 50 mol eq., greater than or equal to about 60 mol eq., greater than or equal to about 70 mol eq., greater than or equal to about 80 mol eq., greater than or equal to about 90 mol eq., or greater than or equal to about 100 mol eq., but it is not limited thereto. With respect to the amount of the quantum dot, the amount of the thiol may be less than or equal to about 6000 mol eq., for example, less than or equal to about 5000 mol eq., less than or equal to about 4000 mol eq., less than or equal to about 3000 mol eq., less than or equal to about 2000 mol eq., less than or equal to about 1000 mol eq., less than or equal to about 900 mol eq., less than or equal to about 800 mol eq., less than or equal to about 700 mol eq., less than or equal to about 600 mol eq., less than or equal to about 500 mol eq., or less than or equal to about 400 mol eq., but it is not limited thereto.

The amount ratio between the polyvalent metal compound and the thiol compound may be selected appropriately. In some embodiments, for the stable ligand exchange, the polyvalent metal compound may be used in an amount that is smaller than that of the thiol compound. For example, per one mole of the polyvalent metal compound, the used amount of the thiol compound may be greater than 1 mole, for example, greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. In some embodiments, per one mole of the polyvalent metal compound, the used amount of the thiol compound may be from about 2 moles to about 10 moles, but it is not limited thereto. When the surface exchange is carried out in the presence of the excess amount of the thiol compound, the quantum dot surface exchanged with the first and the second ligands may show a reduced viscosity in a composition that will be explained below and the increase in the viscosity of the prepared composition over may be suppressed. In embodiments, the polyvalent metal compound may be used in an amount that is greater than that of the thiol compound.

The surface exchanged quantum dot may show improved medium dispersability in comparison with the one that does not undergo the surface exchange. The non-solvent for the surface exchanged quantum dots may be selected considering such changes in the dispersability. In some embodiments, the surface exchanged quantum dots may be recovered using a hydrocarbon solvent such as hexane.

In some embodiments, a quantum dot composition includes a quantum dot including the first ligand and the second ligand on a surface thereof (i.e., as surface exchanged with those ligands), a binder polymer, a polymerizable monomer having a carbon-carbon double bond; and a photoinitiator. The composition may further include an organic solvent. The composition may include a multi-thiol compound having a thiol group at its end terminals. The binder polymer may include a polymer including a repeating unit that has a carboxylic acid group.

In the compositions, details of the (surface exchanged) quantum dots are the same as set forth above. The aforementioned quantum dots may have improved chemical stability and thereby the quantum efficiency deterioration that can occur otherwise may be prevented or suppressed. In the composition, the amount of the quantum dots may be controlled appropriately considering the final use and the other components in the composition. In some embodiments, the amount of the quantum dot may be greater than or equal to about 1 percent by weight (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, or greater than or equal to about 15 wt %, based on the total amount of the composition. The amount of the quantum dot may be less than or equal to about 60 wt %, for example, less than or equal to about 55 wt %, less than or equal to about 50 wt %, less than or equal to about 45 wt %, less than or equal to about 40 wt %, or less than or equal to about 35 wt %, based on the total amount of the composition.

In some embodiments, in the composition or in a quantum dot-polymer composite that will be explained below, the amount of the quantum dot may be about 1 wt % to 70 wt %, based on a total weight of solid contents (non-volatile components) of the composition. For example, based on a total weight of solid contents of the composition, the amount of the quantum dot may be greater than or equal to about 1 percent by weight (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt %. Based on a total weight of solid contents of the composition, the amount of the quantum dot may be less than or equal to about 70 wt %, for example, less than or equal to about 65 wt %, less than or equal to about 60 wt %, less than or equal to about 55 wt %, or less than or equal to about 50 wt %.

In the composition of the embodiments, the binder polymer may include a carboxylic acid group. The binder polymer may include:

a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group;

a multiple aromatic ring-containing polymer including a carboxylic acid group (—COOH) and having a backbone structure in a main chain (e.g., a backbone structure incorporated in the main chain), wherein the backbone structure includes a quaternary carbon atom, which is a part of a cyclic group, and two aromatic rings bound to the quaternary carbon atom;

or a combination thereof.

The copolymer may include a first repeating unit derived from the first monomer, a second repeating unit derived from the second monomer, and optionally, a third repeating unit derived from the third monomer.

The first repeating unit may include a unit represented by Chemical Formula 3-1, a unit represented by Chemical Formula 3-2, or a combination thereof:

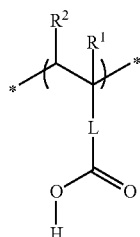

Chemical Formula 3-1 wherein
$R^1$ is hydrogen, a C1 to C3 alkyl group, or —$(CH_2)_n$—COOH (wherein n is 0 to 2),
$R^2$ is hydrogen, a C1 to C3 alkyl group, or —COOH,
L is a single bond, a divalent C1 to C15 aliphatic hydrocarbon group, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, and
* indicates a portion linked to an adjacent atom;

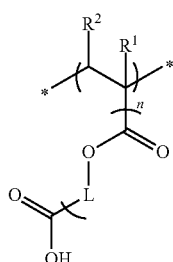

Chemical Formula 3-2 wherein $R^1$ is hydrogen, a C1 to C3 alkyl group, or —$(CH_2)_m$—COOH (wherein m is 0 to 2),
$R^2$ is hydrogen or a C1 to C3 alkyl group,
L is a divalent C1 to C15 alkylene group, a divalent C1 to C15 alkylene group wherein at least one methylene group is substituted with —C(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
n is an integer of 1 to 3, and
* indicates a portion linked to an adjacent atom.

The second repeating unit may include a unit represented by Chemical Formula 4-1, a unit represented by Chemical Formula 4-2, a unit represented by Chemical Formula 4-3, a unit represented by Chemical Formula 4-4, or a combination thereof:

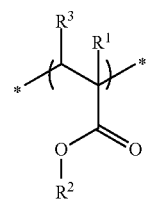

Chemical Formula 4-1 wherein
$R^1$ is hydrogen or a C1 to C3 alkyl group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group, and
* indicates a portion linked to an adjacent atom;

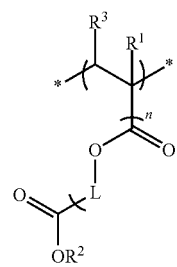

Chemical Formula 4-2 wherein
$R^1$ is hydrogen or a C1 to C3 alkyl group,
L is a divalent C1 to C15 alkylene group, a divalent C1 to C15 alkylene group wherein at least one methylene group is substituted with —C(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, n is an integer of 1 to 3, and

* indicates a portion linked to an adjacent atom;

Chemical Formula 4-3

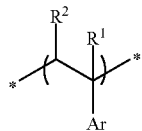

wherein each of $R^1$ and $R^2$ is independently hydrogen or a C1 to C3 alkyl group, Ar is a substituted or unsubstituted C6 to C30 aromatic hydrocarbon group or a substituted or unsubstituted C3 to C30 alicyclic hydrocarbon group, and

* indicates a portion linked to an adjacent atom;

Chemical Formula 4-4

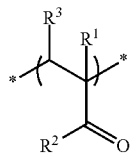

wherein $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and

* indicates a portion linked to an adjacent atom.

The third repeating unit derived from the third monomer may be represented by Chemical Formula 5:

Chemical Formula 5

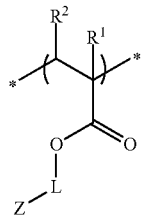

wherein each of $R^1$ and $R^2$ is independently hydrogen or a C1 to C3 alkyl group, L is a divalent C1 to C15 alkylene group, a divalent C1 to C15 alkylene group wherein at least one methylene group is substituted with —C(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, Z is a hydroxyl group (—OH), a mercapto group (—SH), or an amino group (—NHR, wherein R is hydrogen or a C1 to C5 alkyl group) and

* indicates a portion linked to an adjacent atom.

Examples of the first monomer may include, but are not limited to, acrylic acid, methacrylic acid, maleic acid, itaconic acid, fumaric acid, 3-butenoic acid, carboxylic acid vinyl ester compounds such as vinyl acetate, and vinyl benzoate. The first monomer may include one or more compounds.

Examples of the second monomer may include, but are not limited to:

alkenyl aromatic compounds such as styrene, α-methyl styrene, vinyl toluene, or vinyl benzyl methyl ether;

unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;

unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;

maleimides such as N-phenylmaleimide, N-benzylmaleimide, N-alkylmaleimide;

unsaturated carboxylic acid glycidyl ester compounds such as glycidyl acrylate or glycidyl methacrylate;

vinyl cyanide compounds such as acrylonitrile or methacrylonitrile; and unsaturated amide compounds such as acrylamide or methacrylamide, but are not limited thereto.

As the second monomer, at least one compound may be used.

If present, examples of the third monomer may include 2-hydroxy ethyl acrylate, 2-hydroxy ethyl methacrylate, hydroxy propyl acrylate, hydroxy propyl methacrylate, hydroxy butyl acrylate, and hydroxy butyl methacrylate, but are not limited thereto. The third monomer may include one or more compounds.

In the binder polymer, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the binder polymer, an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of the second repeating unit derived from the second monomer may be greater than or equal to about 10 mol %, for example, greater than or equal to about 15 mol %, greater than or equal to about 25 mol %, or greater than or equal to about 35 mol %. In the binder polymer, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of the third repeating unit derived from the third monomer may be greater than or equal to about 1 mol %, for example, greater than or equal to about 5 mol %, greater than or equal to about 10 mol %, or greater than or equal to about 15 mol %. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the binder polymer may be a copolymer of (meth)acrylic acid (i.e., the first monomer) and at least one second or third monomer including arylalkyl(meth)acrylate, hydroxyalkyl (meth)acrylate, or styrene. For example, the binder polymer may include a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

In an embodiment, the binder polymer may include a multiple aromatic ring-containing polymer including a carboxylic acid group (—COOH) and a main chain including a backbone structure incorporated therein, wherein the backbone structure includes a quaternary carbon atom, which is a part of a cyclic group, and two aromatic rings bound to the quaternary carbon atom. The carboxylic acid group may be bonded to the main chain.

In the multiple aromatic ring-containing polymer, the backbone structure may include a unit represented by Chemical Formula A:

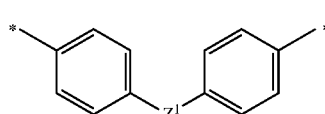

Chemical Formula A wherein

* indicates a portion that is linked to an adjacent atom of the main chain of the binder, $Z^1$ is a linking moiety represented by any one of Chemical Formulae A-1 to A-6, and in Chemical Formulae A-1 to A-6, * indicates a portion that is linked to an adjacent atom in the aromatic ring:

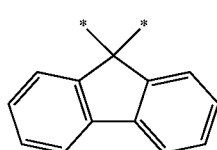

Chemical Formula A-1

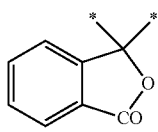

Chemical Formula A-2

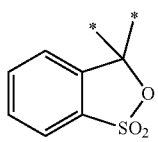

Chemical Formula A-3

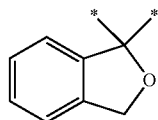

Chemical Formula A-4

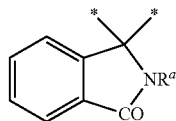

Chemical Formula A-5 wherein $R^a$ is hydrogen, an ethyl group, $C_2H_4Cl$, $C_2H_4OH$, $CH_2CH=CH_2$, or a phenyl group,

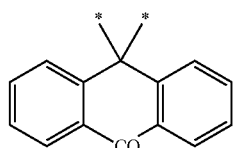

Chemical Formula A-6

The multiple aromatic ring-containing polymer may include a structural unit represented by Chemical Formula B:

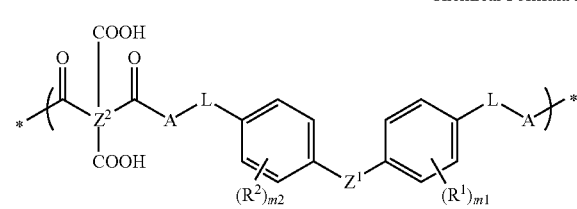

Chemical Formula B wherein $Z^1$ is a linking moiety represented by any one of Chemical Formulae A-1 to A-6, L is a single bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, A is —NH—, —O—, or a C1 to C10 alkylene, each of $R^1$ and $R^2$ is independently hydrogen, a halogen, or a substituted or unsubstituted C1 to C20 alkyl group, m1 and m2 are the same or different, and are independently an integer ranging from 0 to 4, $Z^2$ is a C6 to C40 aromatic organic group, and

* indicate a portion that is linked to an adjacent atom.

In Chemical Formula B, $Z^2$ may be any one of Chemical Formula B-1, Chemical Formula B-2, and Chemical Formula B-3:

Chemical Formula B-1

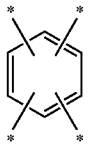

wherein * indicates a portion that is linked to an adjacent carbonyl carbon,

Chemical Formula B-2

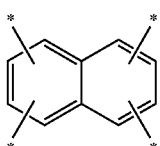

wherein * indicates a portion that is linked to an adjacent carbonyl carbon,

Chemical Formula B-3

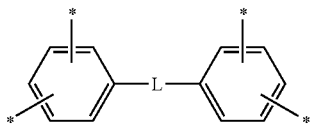

wherein * indicates a portion that is linked to an adjacent carbonyl carbon,
L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein R is independently hydrogen, a C1 to C10 aliphatic hydrocarbon group, a C6 to C20 aromatic hydrocarbon group, or a C3 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula C:

Chemical Formula C

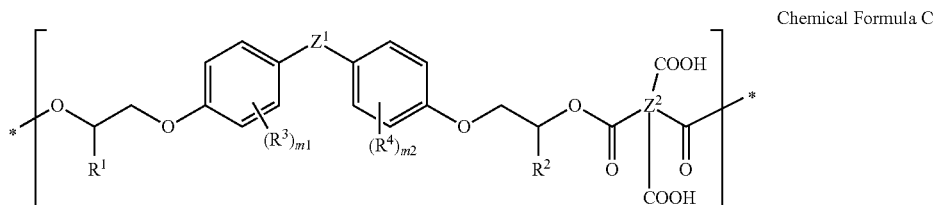

wherein
each of R$^1$ and R$^2$ is independently hydrogen or a substituted or unsubstituted (meth)acryloyloxyalkyl group,
each of R$^3$ and R$^4$ is independently hydrogen, a halogen, or a substituted or unsubstituted C1 to C20 alkyl group,
Z$^1$ is a linking moiety represented by any of Chemical Formulae A-1 to A-6,
Z$^2$ is an aromatic organic group such as the moieties set forth above,
m1 and m2 are the same or different, and are independently an integer ranging from 0 to 4, and
* indicates a portion that is linked to an adjacent atom.

In some embodiments, the multiple aromatic ring-containing polymer may be an acid adduct of a bisphenol fluorene epoxy acrylate monomer. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride. The aforementioned reaction scheme may be summarized as below:

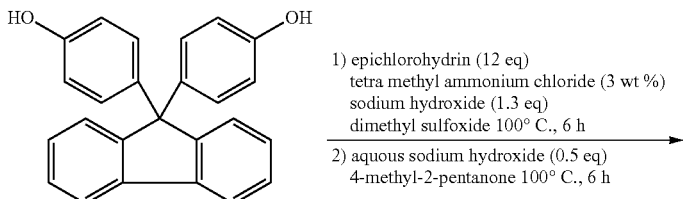

1) epichlorohydrin (12 eq)
   tetra methyl ammonium chloride (3 wt %)
   sodium hydroxide (1.3 eq)
   dimethyl sulfoxide 100° C., 6 h
2) aqueous sodium hydroxide (0.5 eq)
   4-methyl-2-pentanone 100° C., 6 h

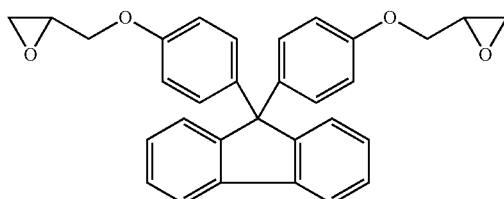

-continued

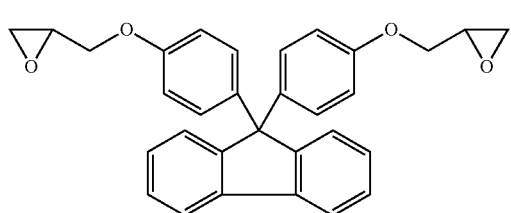
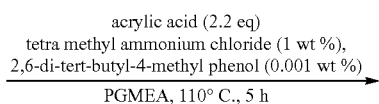
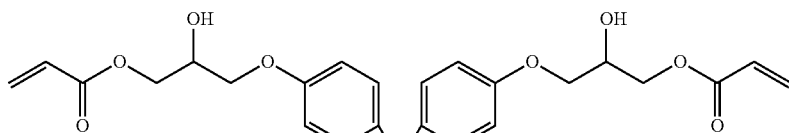

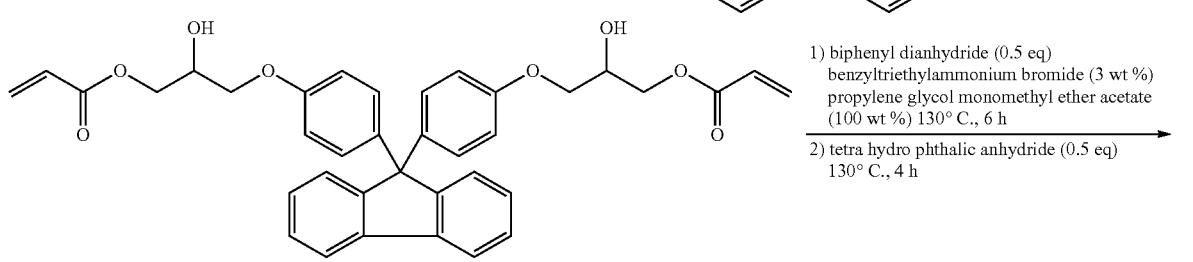
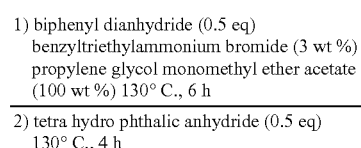

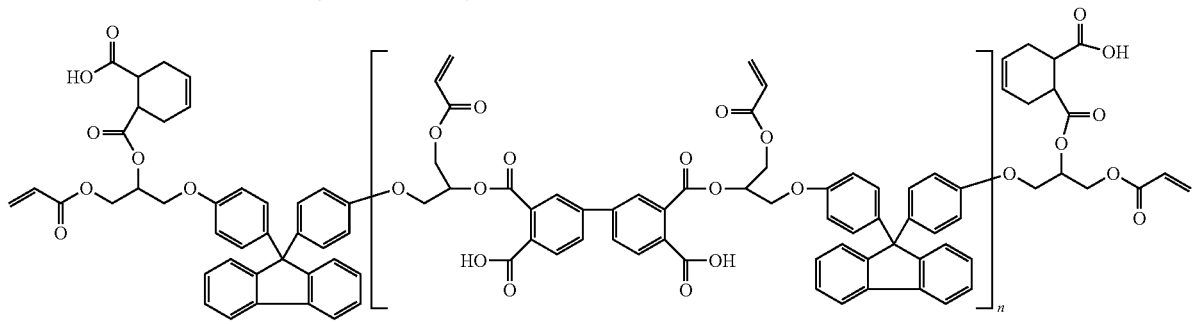

The multiple aromatic ring-containing polymer may include a functional group represented by Chemical Formula D at one or both terminal ends:

Chemical Formula D

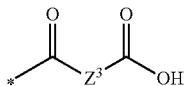

wherein
* indicates a portion that is linked to an adjacent atom, and
$Z^3$ is a moiety represented by one of Chemical Formulae D-1 to D-7:

Chemical Formula D-1

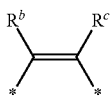

wherein each of $R^b$ and $R^c$ is independently hydrogen, a substituted or unsubstituted C1 to C20 alkyl group, a substituted or unsubstituted C1 to C20 alkyl group, wherein at least one methylene is replaced with an ester group, an ether group, or a combination thereof and
* indicates a portion that is linked to an adjacent atom.

Chemical Formula D-2

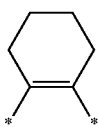

Chemical Formula D-3

Chemical Formula D-4

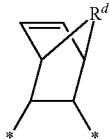

Chemical Formula D-5 wherein $R^d$ is O, S, NH, a substituted or unsubstituted C1 to C20 alkylene group, a C1 to C20 alkylamine group, or a C2 to C20 alkenylamine group.

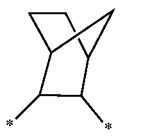

Chemical Formula D-6

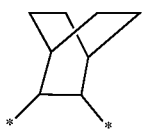

Chemical Formula D-7

The multiple aromatic ring-containing polymer may be synthesized by a known method or is commercially available (e.g., from Nippon Steel Chemical Co., Ltd.).

As non-limiting examples, the multiple aromatic ring-containing polymer may include a structural unit derived from a reaction product of a fluorene compound such as 9,9-bis(4-hydroxyphenyl)fluorene, 9,9-bis(4-aminophenyl)fluorene, 9,9-bis[4-(glycidyloxy)phenyl]fluorene, 9,9-bis[4-(2-hydroxyethoxy)phenyl]fluorene, 9,9-bis-(3,4-dicarboxyphenyl)fluorene dianhydride, or a combination thereof, with an appropriate compound capable of reacting with the fluorene compound. The appropriate compound capable of reacting with the fluorene compound may include, but are not limited to, an aromatic dianhydride such as pyromellitic dianhydride (PMDA), biphenyltetracarboxylic dianhydride (BPDA), benzophenone tetracarboxylic dianhydride, and naphthalene tetracarboxylic dianhydride; a C2 to C30 diol compound; epichlorohydrin; or a combination thereof.

The fluorene compound, the dianhydrides, the diol compound, and the like are commercially available, and the reaction conditions therebetween are known in the art.

The binder polymer may have an acid value of greater than or equal to about 50 milligrams of KOH per gram of the polymer (mg KOH/g). For example, the binder polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The binder polymer may have an acid value of, for example, less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, less than or equal to about 170 mg KOH/g, or less than or equal to about 160 mg KOH/g, but it is not limited thereto.

While not wishing to be bound by theory, it is understood that when the quantum dots are mixed with a solution of a binder having the acid value within the aforementioned range to provide a quantum dot-binder dispersion, the obtained quantum dot-binder dispersion may have the improved compatibility with the other components for the compositions of the embodiments (e.g., photopolymerizable monomer, photoinitiator, solvent, etc.), and thereby the quantum dots may be relatively uniformly dispersed in the final composition (e.g., photoresist composition). Thus, the composition of the embodiments may include a quantum dot binder dispersion including the binder polymer and the quantum dots dispersed therein.

The binder polymer (e.g., containing the carboxylic acid group) may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a molecular weight of less than or equal to about 100,000 g/mol, for example, less than or equal to about 90,000 g/mol, less than or equal to about 80,000 g/mol, less than or equal to about 70,000 g/mol, less than or equal to about 60,000 g/mol, less than or equal to about 50,000 g/mol, less than or equal to about 40,000 g/mol, less than or equal to about 30,000 g/mol, less than or equal to about 20,000 g/mol, or less than or equal to about 10,000 g/mol.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total weight of the composition. An amount of the binder polymer may be less than or equal to about 60 wt %, for example, less than or equal to about 59 wt %, less than or equal to about 58 wt %, less than or equal to about 57 wt %, less than or equal to about 56 wt %, less than or equal to about 55 wt %, less than or equal to about 54 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %, based on the total weight of the composition. In an embodiment, an amount of the binder polymer may be 0.5 to 70 wt %, based on the total weight of solids (i.e., non-volatiles) of the composition. While not wishing to be bound by theory, it is understood that within the aforementioned range, dispersibility of the quantum dots may be ensured.

In the composition, the photopolymerizable monomer having a carbon-carbon double bond may include a photopolymerizable (meth)acrylate monomer. The photopolymerizable (meth)acrylate monomer may include, but are not limited to, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)

acrylate, pentaerythritol di(meth)acrylate, pentaerythritol tri(meth)acrylate, pentaerythritol tetra(meth)acrylate, di pentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

The photopolymerizable (meth)acrylate monomer may include a main monomer having 1 to 6 (meth)acrylate groups. If desired, the photopolymerizable (meth)acrylate monomer may include at least one of a first accessory monomer having 8 to 20 (meth)acrylate groups, and a second accessory monomer represented by Chemical Formula E:

$$R^1O\text{-}(L_1)_m\text{-}L_3\text{-}A\text{-}L_4\text{-}(L_2)_n\text{-}OR^2 \quad \text{Chemical Formula E}$$

wherein,

A is a divalent C1 to C40 aliphatic hydrocarbon group, a divalent C6 to C40 aromatic hydrocarbon group, a divalent moiety including two or more C6 to C40 aromatic hydrocarbon groups linked by a substituted or unsubstituted C1 to C10 alkylene, an ether, or a combination thereof, or an ether (—O—), $L_1$ and $L_2$ are the same or different, and are each independently a substituted or unsubstituted C2 to C5 oxyalkylene, m and n are an integer of 0 to 20, provided that they are not simultaneously 0, $L_3$ and $L_4$ are the same or different, and are each independently a single bond, —O—$(CH_2)_n$—CH(OH)—$CH_2$—, or —$(CH_2)_n$—CH(OH)—$CH_2$—, and $R^1$ and $R^2$ are the same or different, and are each independently $CR_2$=CR— (wherein, R is hydrogen or a methyl group) or $CR_2$=CRCO— (wherein, R is hydrogen or a methyl group).

Types of the main monomer are not particularly limited but may include a (C1 to C20 alkyl) (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, trimethylol propane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof, but it is not limited thereto.

The quantum dot polymer composite including the first accessory monomer and/or the second accessory monomer may show improved developability and improved linearity during a patterning process even when the composition includes a large amount of quantum dots and/or an inorganic light diffusing agent.

The first accessory monomer may have at least 8, for example, at least 10, or at least 12 carbon-carbon double bonds (e.g., (meth)acrylate groups). The number of carbon-carbon double bonds of the first accessory monomer may be less than or equal to about 20. Without being bound by any theory, the introduction of the first accessory monomer increases the number of cross-linkable functional groups, and these functional groups may participate in a cross-linking reaction, thereby the composite may have greater density, and thus, the linearity of the resulting pattern may be improved.

The first accessory monomer may include a hyperbranched (meth)acrylate-based monomer. The hyperbranched monomer may have a regularly branched structure such as a dendrimer. In an embodiment, the hyperbranched monomer may have an incompletely branched or irregular structure. The first accessory monomer may further include at least one (for example, one to four) hydroxy groups, and the density and the developability of the patterned composite may be improved together.

The first accessory monomer may be used alone or as a mixture of at least two compounds.

A weight average molecular weight of the first accessory monomer may be greater than or equal to about 300 grams per mole (g/mol), and for example, less than or equal to about 10,000 g/mol, for example, from about 500 g/mol to about 800 g/mol.

The first accessory monomer may be synthesized by a known method or is commercially available (e.g., from Shin Nakamura Chemical Co., Ltd. or Nippon Kayaku Co., Ltd.).

The second accessory monomer may be represented by Chemical Formula E. For example, the second accessory monomer may be represented by one of Chemical Formula E-1 and Chemical Formula E-2:

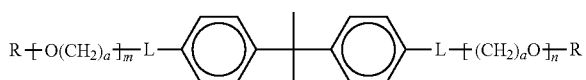

Chemical Formula E-1

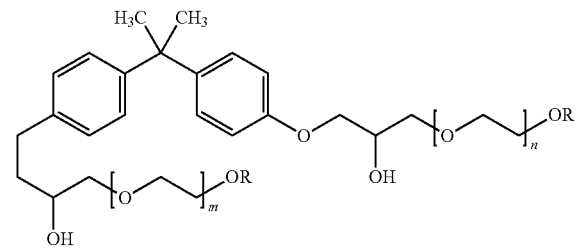

Chemical Formula E-2 wherein, each R is the same or different, and are each independently —COCR=$CR_2$ (R is hydrogen or a methyl group), a is an integer of 1 to 5, m and n are the same as defined in Chemical Formula E, and L is the same or different, and is independently a single bond, C1 to C10 alkylene, or an ether (—O—).

In an exemplary embodiment, the second accessory monomer may include bisphenol A di(meth)acrylate, bisphenol A epoxy (meth)acrylate, bisphenol A ethylene glycol di(meth)acrylate, bisphenol A ethoxylate di(meth)acrylate, poly(ethylene glycol) reacted with bisphenol A glycidyl ether, or a combination thereof.

A weight average molecular weight of the second accessory monomer may be greater than or equal to about 300 g/mol, for example, from about 300 g/mol to about 10,000 g/mol, or from about 700 g/mol to about 1500 g/mol.

When the composition includes a mixture of the photopolymerizable monomers, an amount of the main monomer may be greater than or equal to about 60 wt %, for example, greater than or equal to about 65 wt %, based on the total weight of the mixture of the photopolymerizable monomers. An amount of the main monomer may be less than or equal to about 90 wt %, for example, less than or equal to about 85 wt %, based on the total weight of the mixture of the photopolymerizable monomers.

In the photopolymerizable monomer composition, the sum of the first accessory monomer and the second accessory monomer may be greater than or equal to about 10 wt %, for example, greater than or equal to about 15 wt %, based on the total weight of the mixture of the photopolymerizable monomers. In the photopolymerizable monomer composition, the sum of the first accessory monomer and the second accessory monomer may be less than or equal to about 40 wt %, for example, less than or equal to 35 wt %, based on the total weight of the mixture of the photopolymerizable monomers.

When being used, the amount ratio between the first accessory monomer and the second accessory monomer (the amount of the first accessory monomer: the amount of the second accessory monomer) is about 1:0.1 to 1:10, for example, 1:0.2 to 1:5, 1:0.25 to 1:4, 1:0.5 to 1:2, 1:0.7 to 1:1.3, or 1:0.75 to 1:1.2. In embodiments, the amount of the first accessory monomer is the same or greater than that of the second accessory monomer, but it is not limited thereto.

The amount of the photopolymerizable monomer may be greater than or equal to about 0.5 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt % with respect to a total amount of the composition. Based on a total amount of the composition, the amount of the photopolymerizable monomer may be less than or equal to about 70 wt %, for example, less than or equal to about 60 wt %, less than or equal to about 59 wt %, less than or equal to about 58 wt %, less than or equal to about 57 wt %, less than or equal to about 56 wt %, less than or equal to about 55 wt %, less than or equal to about 54 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, less than or equal to about 30 wt %, less than or equal to about 29 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %.

The photoinitiator included in the composition is a compound capable of initiating a radical polymerization of the photopolymerizable monomer (e.g., acyclic monomer) and/or the thiol compound (that will be explained below). Types of the photoinitiator are not particularly limited. For example, the available photopolymerization initiator may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto.

In a non-limiting example, the examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-bis(trichloromethyl)-6-(piperonyl)-s-triazine, and 2,4-bis(trichloromethyl)-6-(4'-methoxy styryl)-s-triazine, but are not limited thereto.

Examples of the acetophenone compound may be 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, but are not limited thereto.

Examples of the benzophenone compound may be benzophenone, benzoyl benzoate, methyl benzoyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may be thioxanthone, 2-methylthioxanthone, 2-isopropylthioxanthone, 2,4-diethylthioxanthone, 2,4-diisopropylthioxanthone, 2-chlorothioxanthone, and the like, but are not limited thereto.

Examples of the benzoin compound may include benzoin, benzoin methyl ether, benzoin ethyl ether, benzoin isopropyl ether, benzoin isobutyl ether, benzyl dimethyl ketal, and the like, but are not limited thereto.

Examples of the oxime compound may be 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, and the like, but are not limited thereto.

In the composition, an amount of the photoinitiator may be greater than or equal to about 0.01 wt %, for example, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. However, the amount of the photoinitiator is not limited thereto.

In some embodiments, the composition may further include a multi-thiol compound having at least two thiol groups at its terminal ends. The multi-thiol compound may include a compound represented by Chemical Formula 6:

Chemical Formula 6

wherein

R$^1$ includes hydrogen, a substituted or unsubstituted C1 to C30 linear or branched alkyl group, a substituted or unsubstituted C1 to C30 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH$_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously); an isocyanate group; a halogen; —ROR' (wherein R is a substituted or unsubstituted C1 to C20 alkylene group and R' is hydrogen or a C1 to C20 linear or branched alkyl group); an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group), or a combination thereof, L$_1$ includes a carbon atom, a substituted or unsubstituted C1 to C30 alkylene group, a substituted or unsubstituted C1 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, wherein at least one methylene (—CH$_2$—) of the substituted or unsubstituted C1 to C30 alkylene group may be replaced by sulfonyl (—S(=O)$_2$—), carbonyl (—O(=O)—), ether (—O—), sulfide (—S—), sulfoxide (—S(=O)—), ester (—O(=O)O—), amide (—C(=O)NR—) (wherein R is hydrogen or a C1 to C10 alkyl group), or a combination thereof, Y$_1$ includes a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—CH$_2$—) is replaced by sulfonyl (—S(=O)$_2$—), carbonyl (—O(=O)—), ether (—O—), sulfide (—S—), sulfoxide (—S(=O)—), ester (—C(=O)O—), amide (—O(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of Y$_1$ when Y$_1$ is not a single bond, and provided that the sum of k1 and k2 does not exceed the valence of L$_1$.

The multi-thiol compound may include a compound of Chemical Formula 6-1:

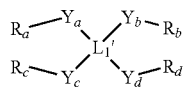

Chemical Formula 6-1 wherein

L$_1$' is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, Y$_a$ to Y$_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of R$_a$ to R$_d$ is independently R$^1$ of Chemical Formula 6 or SH, provided that at least two of them are SH.

The multi-thiol compound may link the plurality of the quantum dots to each other as explained above. In addition, the multi-thiol compound may participate in the reaction with the photopolymerizable monomer without having an adverse effect on the dispersibility of the quantum dots to form a polymerization product (i.e., the thiol-ene polymer). Regarding the thiol-ene polymer, to the disclosure refers to US-2015-0218444-A1, which is incorporated herein by reference in its entirety.

The multi-thiol compound may include a dithiol compound (other than a cis-type dithiol), a trithiol compound, a tetrathiol compound, or a combination thereof. For example, the thiol compound may include glycol di-3-mercaptopropionate, glycol dimercaptoacetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

In the composition, the amount of the multi thiol compound may be less than or equal to about 50 wt %, for example, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, less than or equal to about 30 wt %, less than or equal to about 29 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 11 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, less than or equal to about based on the total weight of the composition. The amount of the multi-thiol compound may be greater than or equal to about 0.1 wt %, for example, greater than or equal to about 0.5 wt %, greater than or equal to about 1 wt %, greater than or equal to about 2 wt %, greater than or equal to about 3 wt %, or greater than or equal to about 4 wt % based on the total weight of the composition.

The composition may further include an organic solvent. Types of the solvent available for the composition of the embodiments are not particularly limited. Types and the amount of the solvent may be determined depending on the types and the amounts of the foregoing main components (i.e., the quantum dots, the COOH group-containing binder, the photopolymerizable monomer combination, the photoinitiator, and if present, the multi thiol compound) and other additives. The composition may include the solvent in such an amount that the remaining amount of the composition other than the amounts of the solid (i.e., non-volatiles) components is the amount of the solvent. The solvent may be selected appropriately considering its affinity for other components (e.g., the binder, the photopolymerizable monomer, the photoinitiator, and other additives), its affinity for the alkali developing solution, and its boiling point.

Examples of the solvent may be: ethyl 3-ethoxy propionate; an ethylene glycol such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol monomethyl ether acetate, ethylene glycol monoethyl ether acetate, diethylene glycol monoethyl ether acetate, and diethylene glycol monobutyl ether acetate; a propylene glycol such as propylene glycol; propylene glycol ethers such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; propylene glycol ether acetates such as propylene glycol monomethyl ether acetate and dipropylene glycol monoethyl ether acetate; amides such as N-methylpyrrolidone, dimethyl formamide, and dimethyl acetamide; ketones such as methyl ethyl ketone (MEK), methyl isobutyl ketone (MIBK), and cyclohexanone; petroleum products such as toluene, xylene, and solvent naphtha; esters such as ethyl acetate, butyl acetate, and ethyl lactate; ethers such as diethyl ether, dipropyl ether, and dibutyl ether; and combinations thereof.

If desired, the composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot polymer composite, and optionally, the patterning of the composite.

The light diffusing agent may increase a refractive index of the composition in order to increase a chance of the incident light to meet with quantum dots. The light diffusing agent may include inorganic oxide particles such as alumina, silica, zirconia, titanium oxide, or zinc oxide particulates, and metal particles such as gold, silver, copper, or platinum, but is not limited thereto.

The leveling agent may prevent stains or spots and to improve planarization and leveling characteristics of a film, and examples thereof may include the following but are not limited thereto. For example, a fluorine-containing leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent may increase adhesion with respect to the substrate, and examples thereof may include a silane coupling agent. Examples of the silane coupling agent may be vinyl trimethoxysilane, vinyl tris(2-methoxyethoxysilane), 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxylpropyltrimethoxysilane, 3-mercaptopropyltrimethoxysilane, and the like. Types and the amounts of the additives may be adjusted, if desired.

If present, the amount of the additives may be greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

The composition of the embodiments may be prepared by a method that includes:

preparing a quantum dot binder dispersion including the plurality of the aforementioned (surface exchanged) quantum dots, the binder polymer (e.g., capable of containing the carboxylic acid group (COON)), and an organic solvent; and mixing the quantum dot binder dispersion with a photoinitiator, the photopolymerizable monomer (e.g., (meth)acrylate monomer), optionally the thiol compound, and optionally, at least one of the foregoing additives.

The quantum dot binder dispersion may be prepared by mixing a solution of the binder polymer and a quantum dot solution.

The foregoing components may be mixed in any order or simultaneously.

The composition may have a shear viscosity of less than or equal to about 10 centipoise (cPs), for example, less than 10 cPs or less than or equal to about 9 cPs, less than or equal to about 8 cPs at a temperature of about 23° C. to 25° C. The composition may have a shear viscosity of greater than or equal to about 2 cPs, for example, greater than or equal to about 3 cPs at a temperature of about 23° C. to 25° C. In some embodiments, the shear viscosity of the composition may be in a range of 4 to 6 cPs at a temperature of about 23° C. to 25° C. As used herein, the shear viscosity is a viscosity that can be measured by using a rotating concentric cylinder viscometer, a rotating cone and plate type viscometer, or a rotating parallel disc type viscometer.

In the composition, the quantum dot may have improved stability and thus the composition may provide enhanced processability without occurrence of gelation after a predetermined period of time. In some embodiments, the composition does not show a substantial change in viscosity when it is left at a temperature of 4° C. for 144 hours (hrs). For example, when the composition is left at a temperature of 4° C. for 144 hrs, a viscosity increase of the composition may be less than or equal to about 10%, for example, less than about 10%, less than or equal to about 9%, less than or equal to about 8%, less than or equal to about 7%, less than or equal to about 6%, less than or equal to about 5%, less than or equal to about 4%, less than or equal to about 3%, less than or equal to about 2%, or even less than or equal to about 1% with respect to its initial viscosity.

The composition may provide a quantum dot polymer composite via a polymerization (e.g., initiated by light). When the polymerization occurs in a selected area, a pattern of the quantum dot polymer composite may be obtained. If desired, the composite thus obtained may undergo a post heating or a post baking process for example, at a temperature of 150° C. to 230° C. (e.g., 180° C.) for a predetermined period of time (e.g., 10 minutes (min) or longer or 20 min or longer).

Thus, in embodiments, a layered structure includes a transparent substrate and a pattern of a quantum dot polymer composite disposed on the transparent substrate, wherein the quantum dot polymer composite includes a polymer matrix; and a plurality of quantum dots and the plurality of quantum dots includes the aforementioned (surface exchanged) quantum dot. The pattern of the quantum dot polymer composite includes a first section emitting a first light and a second section emitting a second light.

The first light and the second light have different maximum peak emission wavelength in a photoluminescent spectrum. In some embodiments, the first light may be a red light having the maximum peak emission wavelength at a range from 620 nm to 650 nm, and the second light may be a green light having the maximum peak emission wavelength at a range from 500 nm to 550 nm.

The transparent substrate may be a substrate including an insulating material. The substrate may include glass; various polymers (e.g., polyester such as polyethylene terephthalate (PET) or polyethylene naphthalate (PEN)), polycarbonate, polyimide, polyamide-imide, poly(meth)acrylate, a thiol-ene polymer, and poly(meth)acrylic acid; polysiloxane (e.g. PDMS); an inorganic material such as $Al_2O_3$ or $ZnO$; or a combination thereof, but is not limited thereto. As used herein, the term "transparent" refers to the case where light transmittance is greater than or equal to about 80%, for example, greater than or equal to about 85% or greater than or equal to about 90% for light (e.g., excitation light) that excites the quantum dots included in the photoluminescent layer. A thickness of the transparent substrate may be appropriately selected considering a substrate material but is not particularly limited. The transparent substrate may have flexibility.

Details of the surface exchanged quantum dot are the same as set forth.

The polymer matrix may include a cross-linked polymer; and a binder polymer (e.g., a linear polymer) having a carboxylic acid-containing repeating unit. The cross-lined polymer may include a thiol-ene polymer, a crosslinked poly(meth)acrylate, or a combination thereof. In some embodiments, the crosslinked polymer may include a polymerization product of the aforementioned photopolymerizable monomer and optionally the multi-thiol compound. Details of the binder polymer are the same as set forth above.

In embodiments, a method of producing the aforementioned layered structure includes forming a film of the aforementioned composition on a transparent substrate;

exposing a selected area of the film to light (e.g., having a wavelength of less than or equal to about 400 nm); and developing the exposed film with an alkaline developer (such as an alkali aqueous solution) to obtain a pattern of a quantum dot polymer composite.

Details of the transparent substrate and the composition are the same as set forth above. A non-limiting method of forming a pattern is explained referring to FIG. 1.

The composition is coated on a transparent substrate in an appropriate manner such as spin coating or slit coating to form a film of a predetermined thickness (e.g., a thickness of less than or equal to about 30 μm for example less than or equal to about 10 μm, less than or equal to about 8 μm, less than or equal to about 7 μm and of greater than about 3 μm, for example, greater than or equal to about 3.5 μm, or greater than or equal to about 4 μm). The formed film may be pre-baked, if desired. The temperature, the time, and the atmosphere for the prebaking are known and may be selected appropriately.

The formed (and optionally pre-baked) film is exposed to light having a predetermined wavelength under a mask having a predetermined pattern. A wavelength and intensity of the light may be selected considering the types and the amounts of the photoinitiator, the types and the amounts of the quantum dots, and the like.

When the exposed film is treated (e.g., immersed or sprayed) with an alkaline developer (e.g., alkaline aqueous solution), the non-exposed areas of the film are dissolved to form a desired pattern. The obtained pattern may be post-baked, if desired, to improve crack resistance and solvent resistance of the pattern, for example, at a temperature of about 150° C. to about 230° C. for a predetermined time (e.g., greater than or equal to about 10 min or greater than or equal to about 20 min).

When a quantum dot-polymer composite is to have a plurality of repeating sections, a plurality of compositions each including the quantum dots with a desired light emitting property (e.g., a desired photoluminescent peak wavelength) is prepared for the formation of each of the repeating sections and the patterning process is repeated as many times as necessary (e.g., two times or three times) for each composition to provide a quantum dot-polymer composite having a desirable pattern. For example, the quantum dot polymer composite may be processed to have a repeating pattern having at least two different color sections (e.g., RGB color sections). The pattern of the quantum dot polymer composite may replace an absorption type color filter and thus may be used as a photoluminescent color filter in a display device. The display device may be a liquid crystal display device and a display including an organic light emitting diode (OLED) as a light source.

In some embodiments, a liquid crystal display includes a backlight unit including a light source to provide a third light, a lower substrate disposed on the backlight unit; the aforementioned layered structure; and a liquid crystal layer interposed between the lower substrate and the layered structure, wherein the layered structure is disposed for the photoluminescent layer to face the liquid crystal layer. A polarizer plate may be disposed below the lower substrate.

Figure 2:
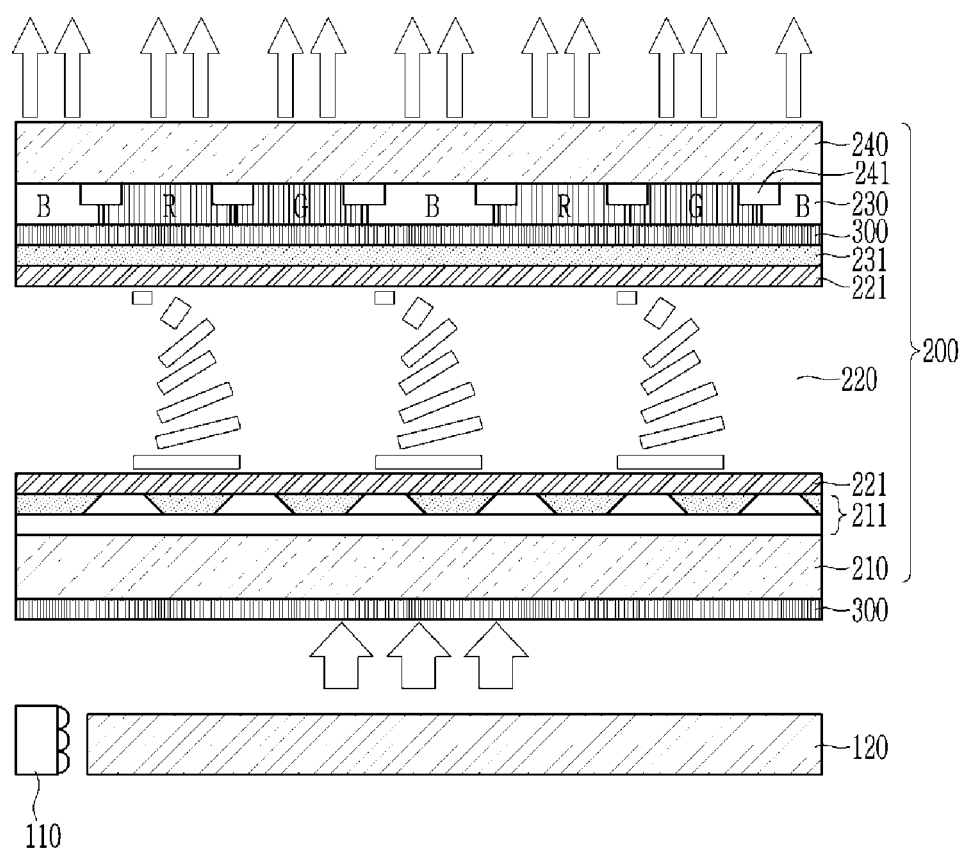
FIG. 2 is a cross-sectional view of an exemplary embodiment of an electronic device.

FIG. 2 is a cross-sectional view schematically illustrating a display device according to a non-limiting embodiment. Referring to FIG. 2, a display device of an embodiment may include a liquid crystal panel 200, a polarizer 300 disposed under the liquid crystal panel 200, and a backlight unit (BLU) disposed under the polarizer 300.

The liquid crystal panel 200 includes a lower substrate 210, a layered structure, a liquid crystal layer 220 disposed between the lower substrate and the layered structure. The layered structure includes a transparent substrate 240 and a photoluminescent layer 230 that includes a pattern of a quantum dot polymer composite.

The lower substrate 210, also referred to as an array substrate, may be a transparent insulation material substrate (e.g., a glass substrate, a polymer substrate including a polyester such as polyethylene terephthalate (PET) or polyethylene naphthalate (PEN), polycarbonate, and/or a polyacrylate, inorganic material substrate of a polysiloxane, $Al_2O_3$, or ZnO). A wire plate 211 is disposed on the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 is disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 may be provided under the lower substrate. Materials and structures of the polarizer 300 are known and are not particularly limited. A backlight unit (e.g., emitting blue light) may be disposed under the polarizer 300. An upper optical element or an upper polarizer 300 may be provided between the liquid crystal layer 220 and the transparent substrate 240, but it is not limited thereto. For example, the upper polarizer may be disposed between the liquid crystal layer 220 and the photoluminescent layer 230. The polarizer may be any polarizer that can be used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue LED, a white LED, or a combination thereof, but is not limited thereto.

The backlight unit may include a light guide panel 120. In an embodiment, the backlight unit may be an edge-type lighting. For example, the backlight unit may include a reflector (not shown), a light guide (not shown) provided on the reflector and providing a planar light source with the liquid crystal panel 200, and/or at least one optical sheet (not shown) on the light guide, for example, a diffusion plate, a prism sheet, and the like, but is not limited thereto. The backlight unit may not have a light guide panel. In some embodiments, the backlight unit may be a direct-type lighting. For example, the backlight unit may have a reflector (not shown), and may have a plurality of fluorescent lamps disposed on the upper side of the reflector at regular intervals, or may have an LED operating substrate on which a plurality of light emitting diodes are disposed, and over them, a diffusion plate and optionally at least one optical sheet may be provided. Details (e.g., each components of light guide and various optical sheets, a reflector, and the like) of such a backlight unit are known and are not particularly limited.

On the bottom surface of the transparent substrate 240, a black matrix 241 having an opening and hiding the gate line, the data line, and the thin film transistor of the wire plate on the lower substrate may be provided. For example, the black matrix 241 may have a lattice shape. In the openings of the black matrix 241, provided is a photoluminescent layer 230 with a pattern of the quantum dot polymer composite including a first section (R) configured to emit a first light (e.g., red light), a second section (G) configured to emit a second light (e.g., green light), and a third section (B) configured to emit/transmit a third light (e.g., blue light). If desired, the photoluminescent layer may further include at least one fourth section. The fourth section may include a quantum dot emitting different colors (e.g., cyan, magenta, and yellow) from the light emitted from the first to third sections.

In the photoluminescent layer 230, the sections constituting a pattern may be repeated corresponding to the pixel areas formed on the lower substrate. A transparent common electrode 231 may be provided on the photoluminescent layer.

The third section (B) configured to emit/transmit blue light may be a transparent color filter that does not change a light emitting spectrum of the light source. In this case, blue light emitted from the backlight unit may pass the polarizer and the liquid crystal layer and then enter as a polarized light and go out as it is. If needed, the third section may include quantum dots emitting blue light.

If needed, the display device may further include a blue light blocking layer (blue filter). The blue filter may be disposed between a surface of the first section (R) and the second section (G) and the transparent substrate 300 or over the transparent substrate (not shown). The blue filter may be in the form of a sheet having an opening in a region corresponding to a pixel area (a third section) displaying blue and thus formed in a region corresponding to first and second sections. In an embodiment, the blue filter may be formed by alternately stacking at least two layers having different refractive indexes and thus may transmit light in a blue wavelength region but block light in the other wavelength regions. The blocked blue light may be reflected and recycled. The blue filter may block light emitted from a blue light source from being directly emitted outside.

In embodiments, a quantum dot polymer composite includes a polymer matrix and a plurality of quantum dots dispersed in the polymer matrix. In some embodiments, the quantum dot polymer composite may be prepared from the foregoing composition. In embodiments, the quantum dot polymer composite may include various types of polymer matrix including a thiol-ene polymer, a (meth)acrylate polymer, a urethane polymer, an epoxy polymer, a vinyl polymer, a silicone polymer, or a combination thereof.

The quantum dot polymer composite may have enhanced stability (e.g., chemical stability and thermal stability) and thus may maintain an increased level of photoconversion efficiency even when it is heated at 180° C. for 30 minutes.

In the quantum dot polymer composite, the amount of the quantum dot is not particularly limited and may be selected appropriately. For example, the amount of the quantum dot may be greater than or equal to about 1 wt %, for example, for example, 2 wt %, greater than or equal to about 3 wt %, greater than or equal to about 4 wt %, or greater than or equal to about 5 wt %, based on a total weight of the composite, but it is not limited thereto. In the quantum dot polymer composite, the amount of the quantum dot may be less than or equal to about 70 wt %, for example, less than or equal to about 65 wt %, less than or equal to about 60 wt %, less than or equal to about 55 wt %, less than or equal to about 50 wt %, less than or equal to about 45 wt %, or less than or equal to about 40 wt %, based on a total weight of the composite, but it is not limited thereto.

Embodiments provide an electronic device including the foregoing quantum dot polymer composite. The electronic device may include a light emitting diode (LED), an organic light emitting diode (OLED), a sensor, a solar cell device, an imaging sensor, or a liquid crystal display device, but it is not limited thereto.

Figure 3:
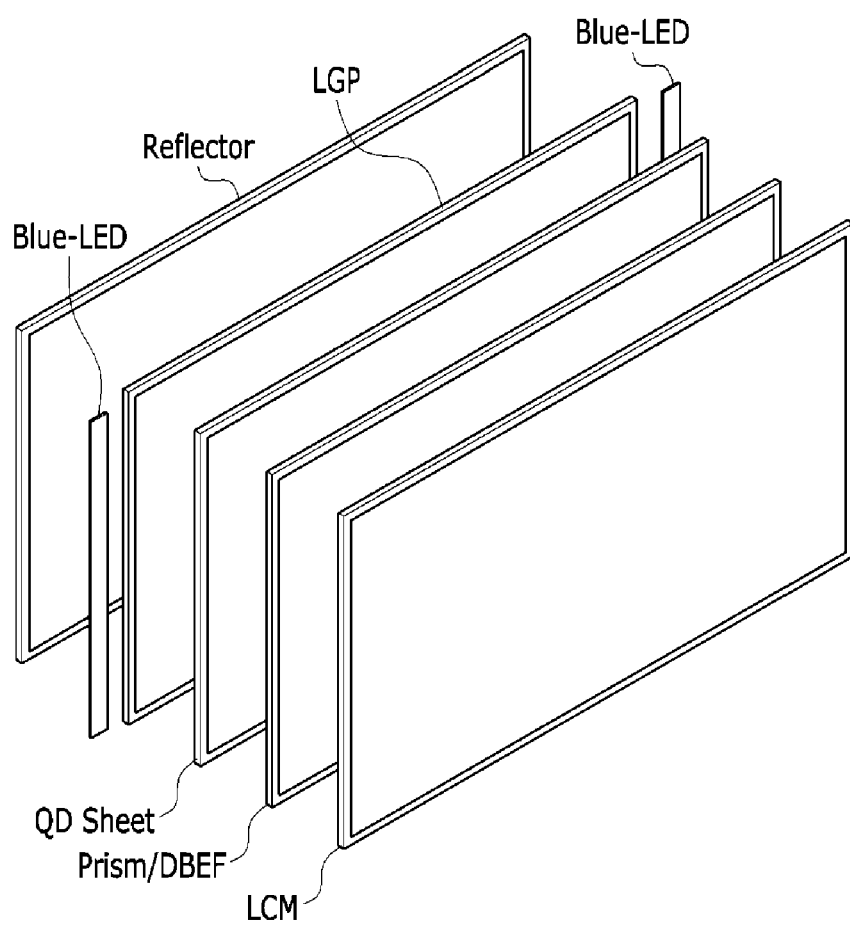
FIG. 3 is an exploded view of an exemplary embodiment of an electronic device.

In some non-limiting embodiments, a schematic layered structure of a liquid crystal display device including the quantum dot sheet is shown in FIG. 3. A general structure of the liquid crystal display (LCD) are known in the art and FIG. 3 schematically shows the same.

Referring to FIG. 3, the liquid crystal display may include a reflector, a light guide panel (LGP), a Blue LED, a quantum dot polymer composite sheet (QD Sheet), various optical sheets such as a prism sheet, a double brightness enhance film (DBEF), which are layered to form a layered structure, and a liquid crystal module (LCM) or liquid crystal panel may be disposed on the top of the layered structure.

Hereinafter, the embodiments are illustrated in more detail with reference to examples. However, the present disclosure is not limited thereto.

EXAMPLES

Analysis Method
[1] Photoluminescence Analysis

A Hitachi F-7000 spectrometer is used to perform a photoluminescence spectrum analysis with irradiation light of 458 nanometers (nm) (532 nm for red quantum dot (QD)). The photoluminescence spectrum of the quantum dots is obtained.

[2] Quantum Yield

The quantum yield is obtained by dividing the number of the photons emitted from the sample by the number of the photons absorbed by the sample. The quantum yield is measured by using HAMAMATSU-Quantaurus-QY, C11347 (purchased from Hamamatsu Co., Ltd.) with respect to a quantum dot containing composition or a quantum dot polymer composite.

[3] Light Conversion Efficiency (CE)

(1) The term "light conversion efficiency" refers to a ratio of emitted light (e.g., front light) with respect to incident light. The light conversion efficiency of the quantum dot is a ratio of emitted light amount of the quantum dot with respect to the light amount absorbed by the same (e.g., as being dispersed in a composition or in the form of a polymer composite) from the excitation light (e.g., blue light). A total amount of the excitation light (e.g., a total amount of the blue light, B) may be obtained by integrating a photoluminescent spectrum of the excitation light. A PL spectrum of the quantum dot polymer composite is obtained and from the obtained PL spectrum, an amount of the blue light (B') and an amount of the light (A) that is emitted from the quantum dot polymer composite and has a green and/or red wavelength range are measured, respectively. Then, the light conversion efficiency is calculated by the following equation:

$A/(B-B') \times 100$=light conversion rate(%).

The quantum dot polymer composite film is inserted between the light guide panel and optical films of a 60 inch television (TV) equipped with a blue LED having a peak wavelength of 449 nm. Then, the TV is operated and the luminous properties are analysed by using a spectro-radi-ometer (Konica Minolta, CS-2000) placed 30 centimeters in front of the TV to obtain a photoluminescent spectrum of the emitted light.

[4] Relative Quantum Yield (QY)

The relative QY is a ratio (a percentage) of the quantum yield of the given quantum dot with respect to the quantum yield of the reference quantum dot.

[5] Viscosity

The viscosity of the composition is measured by using Brookfield LVDV-II-Rheometer or HAAKE Rheostress 600.

[6] Thermogravimetric Analysis

A thermogravimetric analysis is carried out by using TA Q5000 (Q50001R) (manufactured from TA instruments Co. Ltd.)

[7] Nuclear Magnetic Resonance (NMR) Analysis

A NMR analysis for the quantum dot is carried out by using a NMR spectrometer (FT-NMR (500 MHz) (ASCEND 500) of Bruker).

Preparation of Cadmium Free Core-Shell Quantum Dots

Red light emitting quantum dots and Green light emitting quantum dots are prepared in accordance with the following procedure.

Reference Example 1

Production of Red or Green Light Emitting Non-Cadmium Quantum Dots (1) 0.2 millimoles (mmol) of indium acetate, optionally 0.1 mmol of zinc oleate, 0.6 mmol of palmitic acid, and 10 milliliters (mL) of 1-octadecene are placed in a flask, subjected to a vacuum state at 120° C. for one hour, and heated to 280° C. after the atmosphere in the flask is exchanged with $N_2$. Then, a mixed solution of 0.1 mmol of tris(trimethylsilyl)phosphine ($TMS_3P$) and 0.5 mL of trioctylphosphine (TOP) is quickly injected, and the reaction proceeds for a predetermined time (e.g., for 20 minutes). The reaction mixture then is rapidly cooled and acetone is added thereto to produce nanocrystals, which are then separated by centrifugation and dispersed in toluene to obtain the InP or InZnP core nanocrystals.

0.3 mmol (0.056 grams, g) of zinc acetate, 0.6 mmol (0.189 g) of oleic acid, and 10 mL of trioctylamine are placed in a flask, subjected to a vacuum state at 120° C. for 10 minutes, and then heated to 220° C. after the atmosphere in the flask is exchanged with $N_2$. Then, a toluene dispersion of the InP core nanocrystals prepared as described above (optical density: 0.15) and 0.6 mmol of S/TOP (i.e., sulfur dissolved or dispersed in the trioctylphosphine) or a mixture of S/TOP and Se/TOP (with a mole ratio of Se:S=1:3) are added to the flask, and then, the resulting mixture is heated to 280° C., while the reaction proceeds for 30 minutes. After the reaction, the reaction solution is quickly cooled to room temperature to obtain a reaction mixture including InP/ZnS or InZnP/ZnSeS semiconductor nanocrystals.

(2) An excess amount of ethanol is added to the reaction mixture including the resulting semiconductor nanocrystals, which is then centrifuged to remove an extra organic material from the reaction mixture of the semiconductor nanocrystals. After centrifugation, the supernatant is discarded and the precipitate is dried and dispersed in chloroform to obtain a quantum dot solution (hereinafter, QD solution). A UV-vis absorption spectrum and a photoluminescent spectrum of the QD solution are measured.

The prepared quantum dot including InP/ZnS semiconductor nanocrystal and the prepared quantum dot including InZnP/ZnSeS semiconductor nanocrystal absorb light of a wavelength of 350 nm to 500 nm to emit (red) light having a wavelength of about 600 to 650 nm and (green) light having a wavelength of about 520 nm to 550 nm, respectively. The quantum yield of the prepared quantum dot is greater than or equal to about 50% (e.g., 50% to 100%).

Preparation of Cadmium Based Core-Shell Quantum Dots

Reference Example 2

Production of Green Light Emitting Quantum Dots

Green light emitting quantum dots having a CdSe/ZnS alloyed core and a CdZnS shell are prepared as below:

(1) 0.4 millimoles (mmol) of CdO, 0.8 mmol of octadecylphosphonic acid, and 16 g of trioctylamine are placed in a flask, subjected to a vacuum state at 150° C. with stirring, and heated to 300° C. to form a Cd mixed solution after the atmosphere in the flask is exchanged with $N_2$. A Se powder (Alfa, 200 mesh 99.999%) and trioctylphosphine (Aldrich, 90%) as a 2.0 molar (M) solution are reacted to form a Se precursor, 1 mL of which is rapidly injected to the Cd mixed solution at 300° C. and after 2 minutes, the resulting solution is cooled to 50 to 60° C.

After being quickly cooled to room temperature, ethanol is added to the reaction solution and centrifuged to obtain a precipitate (CdSe), which is then dispersed in toluene.

(2) 0.4 mmol of zinc acetate, 0.8 mmol of oleic acid, and 16 g of trioctylamine are placed in a flask, subjected to a vacuum state at 150° C., and then heated to 300° C. after the atmosphere in the flask is exchanged with $N_2$. Then, a toluene dispersion of the CdSe nanocrystals prepared (1 mL) and 2 mL of n-octanethiol solution diluted with a predetermined amount of trioctylamine (TOA) are added to the reaction flask and then a reaction proceeds for 40 minutes. After the completion of the reaction, the reaction solution is quickly cooled to room temperature and ethanol is added thereto and the resulting mixture is centrifuged to recover a precipitate, which is then dispersed in toluene to provide a CdSe/ZnS core solution.

(3) 0.05 mmol of cadmium acetate, 0.4 mmol of zinc acetate, 1.5 mL of oleic acid, and 20 mL of trioctylamine are placed in a reaction flask, subjected to a vacuum state at 120° C. with stirring, and heated to 320° C. after the atmosphere in the flask is exchanged with $N_2$. 0.6 mL of the CdSe/ZnS core solution and 2 mL of S/TOP are quickly injected and the reaction proceeds for 30 minutes. After the completion of the reaction, the reaction solution is quickly cooled to room temperature, ethanol is added thereto, and the resulting mixture is centrifuged to obtain a precipitate, which is then dispersed in chloroform to obtain a cadmium based quantum dot solution.

Pattern Formation of Quantum Dot Polymer Composite

Reference Example 3

[1] Preparation of Quantum Dot-Binder Dispersion

A chloroform dispersion of green light emitting quantum dots (InP/ZnS core/shell) prepared in Reference Example 1 is mixed with a solution of a binder polymer of a four membered copolymer of methacrylic acid, benzyl methacrylate, hydroxyethyl methacrylate, and styrene, (acid value: 130 milligrams (mg) per gram of KOH (mg KOH/g), molecular weight: 8,000 g/mol, acrylic acid:benzyl methacrylate:hydroxyethyl methacrylate:styrene (molar ratio) =61.5%:12%:16.3%:10.2%) (solvent: propylene glycol monomethyl ether acetate, PGMEA, a concentration of 30 percent by weight, wt %) to form a quantum dot-binder dispersion.

[2] Preparation of the Photosensitive Composition

To the quantum dot-binder dispersion prepared in item [1], a hexaacrylate having the following structure (as a photopolymerizable monomer), ethylene glycol di-3-mercaptopropionate (hereinafter, 2T, as a multi-thiol compound), an oxime ester compound (as an initiator), $TiO_2$ (as a light diffusing agent), and PGMEA (as a solvent) are added to obtain a composition.

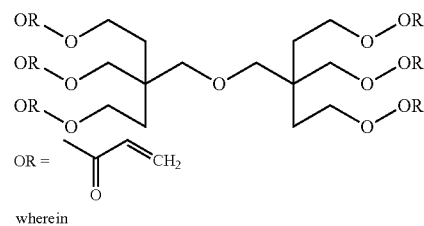

wherein

The prepared compositions includes 12 wt % of quantum dots, 28 wt % of the binder polymer, 4.5 wt % of the thiol compound, 2 wt % of the photopolymerizable monomer, and 0.1 wt % of the photoinitiator, 3 wt % of the light diffusing agent, and a balance amount of the solvent, based on a total weight of the composition.

[3] Formation of Quantum Dot-Polymer Composite The composition obtained from item [2] is spin-coated on a glass substrate at 150 revolutions per minute (rpm) for 5 seconds (s) to provide a film. The obtained film is pre-baked at 100° C. for 2 minutes (min) (PRB). The pre-baked film is exposed to light (wavelength: 365 nanometers (nm), intensity: 60 millijoules, mJ) under a mask having a predetermined pattern (e.g., a square dot or stripe pattern) for 1 s (EXP) and developed with a potassium hydroxide aqueous solution (conc.: 0.043%) for 50 seconds to obtain a quantum dot polymer composite.

[4] Post Bake (POB) Treatment

The patterned film prepared in item [3] is heated at 180° C. for 30 minutes for a POB treatment.

For each of the composition, the prebaked film, the exposed film, and the post baked film, a quantum yield is measured. The ratio of the quantum yield with respect to the initial quantum yield is calculated for each of the composition, the prebaked film, the exposed film, and the post baked film, and the results are shown in Table 1.

Reference Example 4

A quantum dot polymer composite and a pattern thereof are prepared in the same manner set forth in Reference Example 3 except for using a chloroform dispersion of the Cd based quantum dot of Reference Example 2 (CdSe alloy core/CdZnS shell, green light emitting). The quantum yield of each of the composition, the prebaked film, the exposed film, and the post baked film is measured. The ratio of the quantum yield with respect to the initial quantum yield for each of the composition, the prebaked film, the exposed film, and the post baked film is calculated and the results are shown in Table 1.

TABLE 1

| | initial | PR composition | After PRB | After EXP | After POB |
|---|---|---|---|---|---|
| Ref. Example 3 | 100% | 81.8% | 78.7% | 76.1% | 60.1% |
| Ref. Example 4 | 100% | 100.4% | 93.0% | 90.1% | 88.0% |

The results of Table 1 confirm that the indium based cadmium free quantum dot of Reference Example 1 suffers a significant decrease in the quantum efficiency during the preparation of the composition and the quantum dot polymer composite in comparison with the cadmium based quantum dot of Reference Example 2.

Surface Exchange Treatment for the Quantum Dot with the First Ligand and the Second Ligand Example 1

To 50 mL of the QD solution of Reference Example 1 (the amount of the quantum dot is about 1 g), 0.563 g of zinc acrylate (ZA) and 1.6875 mL of dodecanethiol (DDT) are added with respect to the amount of the quantum dot to obtain a reaction solution. The obtained reaction solution is stirred at 60° C. for 1 hr.

After the stirring, a non-solvent is added to the reaction solution to precipitate quantum dots, which is then centrifuged to provide a quantum dot surface exchanged with the zinc acrylate and the dodecanethiol (hereinafter, ZA-DDT QD). The ZA-DDT QD is re-dispersed in chloroform.

Example 2

The surface exchange treatment is conducted in the same manner as Example 1 except for using 3-methoxybutyl-3-mercaptopropionate (MBMP) instead of dodecanethiol to obtain a quantum dot surface exchanged with the zinc acrylate and the 3-methoxybutyl-3-mercaptopropionate (hereinafter, ZA-MBMP QD). The ZA-MBMP QD is re-dispersed in chloroform.

Example 3

The surface exchange treatment is conducted in the same manner as Example 1 except for using hexanethiol (HT) instead of dodecanethiol to obtain a quantum dot surface exchanged with the zinc acrylate and the hexanethiol (hereinafter, ZA-HT QD). The ZA-HT QD is re-dispersed in chloroform.

Example 4

The surface exchange treatment is conducted in the same manner as Example 1 except for using octanethiol (OT) instead of dodecanethiol to obtain a quantum dot surface exchanged with the zinc acrylate and the octanethiol (hereinafter, ZA-OT QD). The ZA-OT QD is re-dispersed in chloroform.

Example 5

$CS_2$ and dibutylamine are reacted at room temperature (about 25° C.) for 10 minutes to obtain dibutyldithiocarbamic acid.

The surface exchange treatment is conducted in the same manner as Example 1 except for using dibutyldithiocarbamic acid (DTC) instead of dodecanethiol to obtain a quantum dot surface exchanged with the zinc acrylate and the dibutyldithiocarbamic acid (hereinafter, ZA-DTC QD). The ZA-DTC QD is re-dispersed in chloroform.

Example 6

To 50 mL of the green light emitting QD solution of Reference Example 1 (the amount of the quantum dot is about 1 g), 0.225 g of zinc acrylate (ZA) and 0.27 mL of MBMP are added with respect to the amount of the quantum dot to obtain a reaction solution. The obtained reaction solution is stirred at 60° C. for 1 hr.

After the stirring, a non-solvent is added to the reaction solution to precipitate quantum dots, which is then centrifuged to provide a quantum dot surface exchanged with the zinc acrylate and the MBMP (hereinafter, ZA-MBMP 200-800 QD). The ZA-MBMP 200-800 QD is re-dispersed in chloroform.

Example 7

To 50 mL of the green light emitting QD solution of Reference Example 1 (the amount of the quantum dot is about 1 g), 0.1125 g of zinc chloride ($ZnCl_2$) and 0.27 mL of MBMP are added with respect to the amount of the quantum dot to obtain a reaction solution. The obtained reaction solution is stirred at 60° C. for 1 hr.

After the stirring, a non-solvent is added to the reaction solution to precipitate quantum dots, which is then centrifuged to provide a quantum dot surface exchanged with the zinc chloride and the MBMP (hereinafter, $ZnCl_2$-MBMP 150-800 QD). The $ZnCl_2$-MBMP 150-800 QD is re-dispersed in chloroform.

Comparative Example 1

The surface exchange treatment is conducted in the same manner as Example 1 except for not using the second ligand (i.e., the thiol compound) to obtain a quantum dot surface exchanged with the zinc acrylate (hereinafter, ZA QD). The ZA QD is re-dispersed in chloroform.

Comparative Example 2

The surface exchange treatment is conducted in the same manner as Example 1 except for not using the first ligand (i.e., the zinc acrylate) to obtain a quantum dot surface exchanged with the dodecanethiol (hereinafter, DDT QD). The DDT QD is re-dispersed in chloroform.

Comparative Example 3

The surface exchange treatment is conducted in the same manner as Example 1 except for not using the first ligand (i.e., the zinc acrylate) and using 3-methoxybutyl 3-mercaptopropionate (MBMP) instead of the DDT to obtain a quantum dot surface exchanged with the 3-methoxybutyl 3-mercaptopropionate (hereinafter, MBMP QD). The MBMP QD is re-dispersed in chloroform.

Comparative Example 4

The surface exchange treatment is conducted in the same manner as Example 1 except for not using the first ligand (i.e., the zinc acrylate) and using octanethiol (OT) instead of the DDT to obtain a quantum dot surface exchanged with the octanethiol (hereinafter, OT QD). The OT QD is re-dispersed in chloroform.

Preparation of Photosensitive Composition Including the Surface Exchanged Quantum Dot Reference Example 5

Using a chloroform dispersion including any of the surface exchanged quantum dots (InP/ZnS core/shell) prepared in Examples 1 to 4 and Comparative Examples 1 to 4 and the quantum dot of Reference Example 1, a photosensitive composition is prepared in the following manner and a quantum dot polymer composite is prepared from each of the prepared compositions.

[1] Preparation of Quantum Dot-Binder Dispersion

A quantum dot binder dispersion is prepared in the same manner as set forth in Reference Example 3 except for using each of the QD solution including any of the surface exchanged quantum dots (InP/ZnS core/shell) prepared in Examples 1 to 4 and Comparative Examples 1 to 4.

[2] Preparation of Composition

To the quantum dot binder dispersion, prepared in item [1], a hexaacrylate having the following structure (as a photopolymerizable monomer), ethylene glycol di-3-mercaptopropionate (hereinafter, 2T as a multi-thiol compound), an oxime ester compound (as an initiator), $TiO_2$ (as a light diffusing agent), and PGMEA are added to obtain a composition.

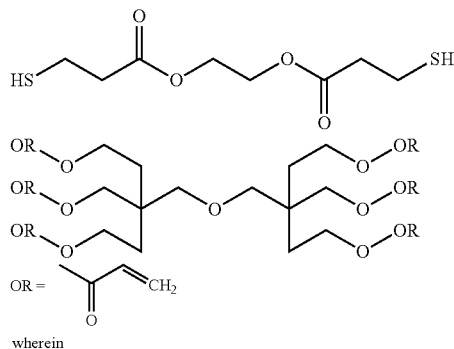

wherein

The prepared compositions includes 12 wt % of quantum dots, 28 wt % of the binder polymer, 4.5 wt % of 2T, 2 wt % of the photopolymerizable monomer, and 0.1 wt % of the photoinitiator, 3 wt % of the light diffusing agent, and a balance amount of the solvent, based on a total weight of the composition.

[3] Formation of Quantum Dot-Polymer Composite

The composition obtained from item [2] is spin-coated on a glass substrate at 150 revolutions per minute (rpm) for 5 seconds (s) to provide a film. The obtained film is pre-baked at 100° C. for 2 minutes (PRB). The pre-baked film is exposed to light (wavelength: 365 nm, intensity: 60 mJ) for 1 second (s) (EXP) to conduct a polymerization, thereby a quantum dot polymer composite is obtained. The obtained quantum dot polymer composite is post-baked at 180° C. for 30 minutes.

Evaluation of Properties of the Surface Exchanged Quantum Dot and a Quantum Dot Polymer Composite Including the Same Experimental Example 1

[1] Each of the QD solution of Reference Example 1 (Ref. QD), the QD solution of Example 2 (ZA-MBMP QD), the QD solution of Comparative Example 1 (ZA QD), and the QD solution of Comparative Example 3 (MBMP QD) is used to prepare a photosensitive composition and a quantum dot polymer composite film having a predetermined thickness in the same manner of Reference Example 5.

[2] For each of the composition prepared by using the QD solution of Reference Example 1 (Ref QD composition), the composition prepared by using the QD solution of Example 2 (ZA-MBMP QD composition), and the composition prepared by using the QD solution of Comparative Example 1 (ZA QD composition), an initial viscosity is measured and a viscosity is measured again after being left at a temperature of 4° C. for 144 hrs in order to observe a change in the viscosity with respect to the initial value. The results are shown in Table 2.

TABLE 2

| | Initial viscosity (cPs) | Viscosity after 144 hrs (cPs) | Viscosity increase |
|---|---|---|---|
| Ref QD composition | 13.3 | 13.3 | 0% |
| ZA-MBMP QD composition | 8.8 | 8.8 | 0% |
| ZA QD composition | 9.0 | 109.4 (after one day) | NA |

[3] For each of the composite film prepared from the QD solution of Reference Example 1 (Ref QD film), the composite film prepared from the QD solution of Example 2 (ZA-MBMP QD film), and the composite film prepared from the QD solution of Comparative Example 3 (MBMP QD film), a light conversion efficiency (C.E., %) is measured after the pre-bake process and after the post bake process, respectively. The results are shown in Table 3. In Table 3, the process maintenance ratio is the C.E. after the POB/the C.E. after the PRB.

TABLE 3

| | CE after the PRB | CE after the POB | Process maintenance ratio |
|---|---|---|---|
| Ref QD FILM | 100% | 79% | 79% |
| ZA-MBMP QD FILM | 102% | 89% | 87% |
| MBMP QD FILM | 100% | 75% | 75% |

The results of Table 2 and Table 3 confirm that the composition including the QD solution of Comparative Example 1 (ZA QD) has an excessively high viscosity and thus it is practically impossible to apply the same to a patterning process. The composition prepared from the QD solution of Example 2 has a proper initial viscosity and there occurs substantially no change in its viscosity when being stored at a predetermined temperature. The quantum dot polymer composite prepared from the QD solution of Example 2 has an improved light conversion efficiency even after a heat treatment at a high temperature, in comparison with those of the QD solution of Comparative Example 3 and the QD solution of Reference Example 1.

Experimental Example 2

Composition 1 (including Ref. QD) and Composition 2 (including ZA-MBMP QD) are prepared in the same manner as Reference Example 3 using the QD solution of Reference Example 1 (Ref. QD) and the QD solution of Example 2 (ZA-MBMP OD), respectively. The QD solution of Reference Example 1, Composition 1, and Composition 2 are stored at 25° C. for 24 hours and the quantum efficiency of the quantum dot is measured. The results are shown in Table 4.

TABLE 4

|  | Relative quantum efficiency after 24 hours with respect to the initial quantum efficiency |
|---|---|
| the QD solution of Reference Example 1 | about 100% |
| Composition 1 | 87% |
| Composition 2 | about 100% |

The results of Table 4 confirm that Composition 2 including the quantum dot of Example 2 may have increased room temperature storage stability with respect to Composition 1 including Ref. QD.

Experimental Example 3

For the QD solution of Example 1 (ZA-DDT QD), the QD solution of Example 3 (ZA-HT QD), and the QD solution of Example 4 (ZA-OT QD), and the QD solution of Comparative Example 1 (ZA QD), Relative Photoluminescent QY (%) is measured based on that of the QD solution of Reference Example 1 (Ref. QD) and the results are shown in Table 5. The relative PL QY is a ratio of the quantum yield with respect to the PL QY of the Ref. QD.

TABLE 5

| The QD included in the solution | Relative PLQY (%) |
|---|---|
| Ref. QD | 100% |
| ZA-DDT QD | 133% |
| ZA-HT QD | 121% |
| ZA-OT QD | 123% |
| ZA QD | 103% |

The results of Table 5 confirm that the quantum dot of the Examples may have improved PLQY with respect to those of the Ref. QD and the QD of the Comparative Examples.

Experimental Example 5

A composition is prepared in the same manner as set forth in Reference Example 3 by using the QD solution of Reference Example 1 (Ref. QD), the QD solution of Example 1 (ZA-DDT QD), the QD solution of Comparative Example 1 (ZA QD), the QD solution of Comparative Example 2 (DDT QD), respectively, and the absolute PL QY (%) is measured for each of the compositions. The results are shown in Table 6.

TABLE 6

| The QD included in the composition | Absolute PLQY (%) |
|---|---|
| Ref. QD | 67% |
| ZA-DDT QD | 82% |
| ZA QD | 77% |
| DDT QD | 76% |

The results of Table 6 confirm that the quantum dots of the Examples may have improved quantum efficiency in comparison with the quantum dots of the Reference Example and the Comparative Examples, indicating the enhanced chemical stability of the quantum dots prepared in the Examples.

Experimental Example 6

A composition and a quantum dot polymer composite are prepared in the same manner as set forth in Reference Example 3 by using the QD solution of Reference Example 1 (Ref. Green QD), the QD solution of Example 6 (ZA-MBMP 200-800 Green QD), and the QD solution of Example 7 (ZnCl$_2$-MBMP 150-800, Green QD), respectively, and the viscosity and the light conversion efficiency are measured for each of the compositions and the composites after the PRB and the POB, respectively, and thereby the process maintenance ratio (i.e., the C.E. after the POB/the C.E. after the PRB) is calculated. The results are shown in Table 7.

TABLE 7

|  | Ref. Green QD | ZA-MBMP 200-800 Green QD | ZnCl$_2$-MBMP 150-800, Green QD |
|---|---|---|---|
| Light conversion Efficiency (CE) after the POB | 32.8% | 37.6% | 36.7% |
| Process Maintenance ratio | 80% | 92% | 92% |
| viscosity (1 day, cPs) | 4.86 | 7.45 | 4.31 |

The results of Table 4 confirm that the quantum dot having the first and the second ligand may have improved thermal stability and luminous properties after the heat treatment at a high temperature.

Experimental Example 7 TGA Analysis and NMR Analysis

Figure 4:
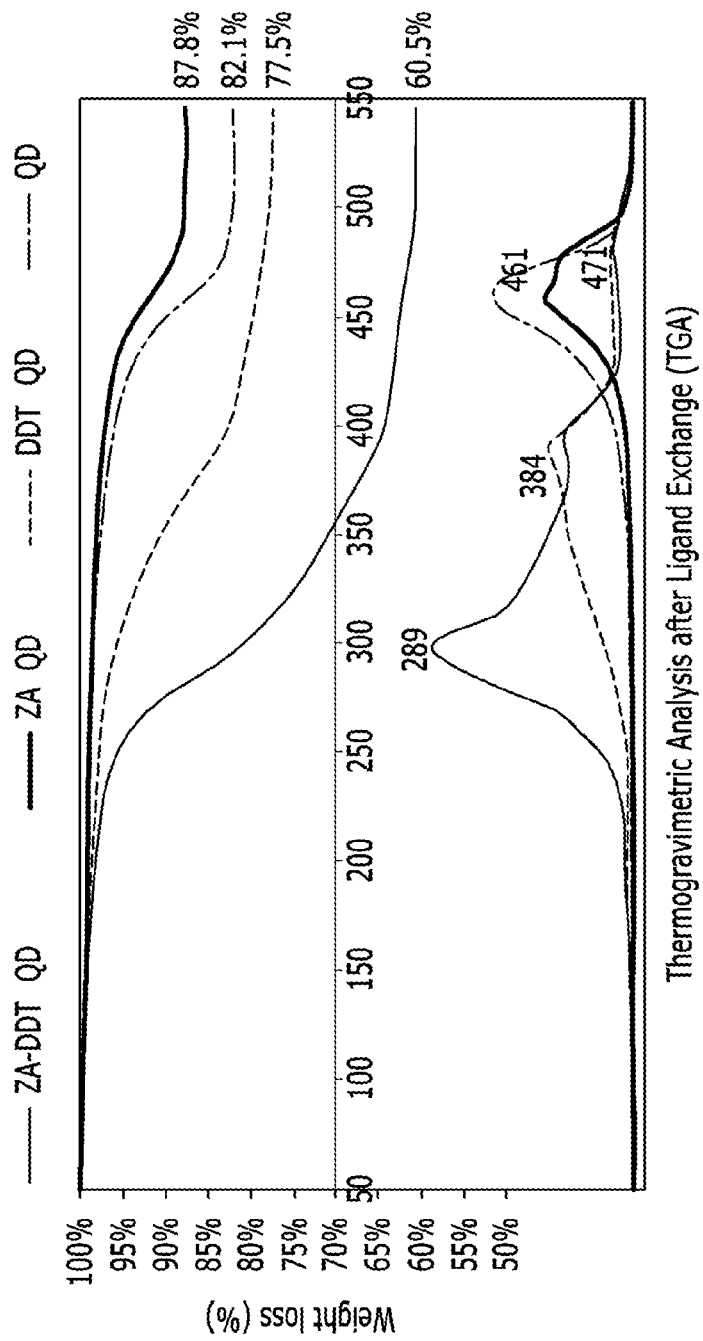
FIG. 4 is a graph showing the results of a thermogravimetric analysis of each of the quantum dots prepared in Reference Example 1, Comparative Examples 1 and 2, and Example 1.

[1] A thermogravimetric analysis is made for each of the quantum dot of Reference Example 1 (QD), the quantum dot of Example 1 (ZA-DDT QD), and the quantum dot of Comparative Examples 1 and 2 (ZA QD, DDT QD). The results are shown in FIG. 4. The results of FIG. 4 confirm that in the case of the quantum dot of Example 1, the 5% weight loss occurs at a relatively low temperature of less than 300° C. (e.g., less than or equal to about 280° C.) in comparison with those of the Comparative Examples and the Reference Example. These results may suggest that the surface of the quantum dot of Example 1 is passivated with the ligands more densely than those of the Comparative Examples.

Figure 5:
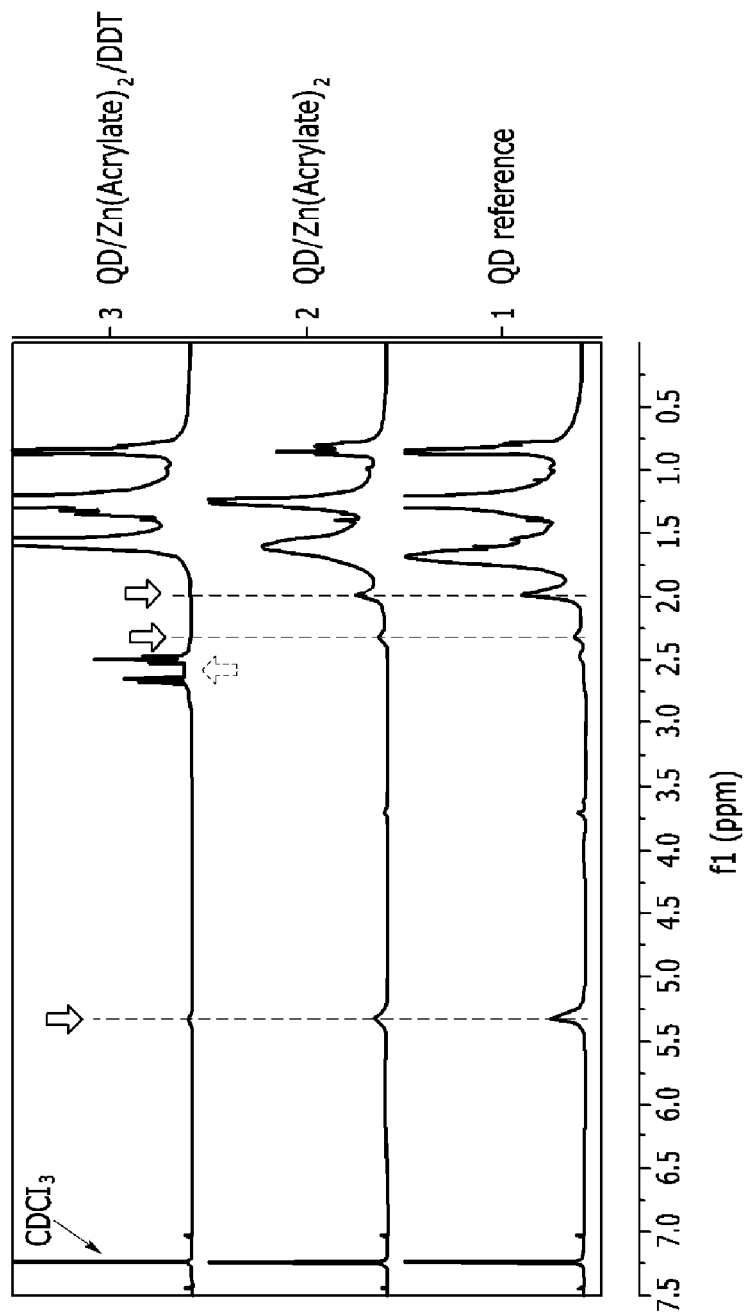
FIG. 5 is a graph showing the results of a Nuclear Magnetic Resonance (NMR) analysis of the quantum dots prepared in Reference Example 1, Comparative Example 1, and Example 1.

[2] A NMR analysis is made for each of the quantum dot of Reference Example 1, the quantum dot of Example 1, and the quantum dot of Comparative Example 1. The results are shown in FIG. 5. In FIG. 5, as to the quantum dot of Example 1 (ZA-DDT QD), broad peaks are observed at 1.2 parts per million (ppm) and 1.6 ppm due to the passivation ligand. In addition, broad peaks caused by the thiol passivation are observed between 2.6~3.0 ppm.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising:
a semiconductor nanocrystal particle;
a first ligand bound to a surface of the semiconductor nanocrystal particle; and
a second ligand bound to the surface of the semiconductor nanocrystal particle,
wherein the second ligand comprises a compound represented by Chemical Formula 2-1, Chemical Formula 2-2, or Chemical Formula 2-3:

$$R^a\text{-L-}(CRR)_n SM \quad \text{Chemical Formula 2-1}$$

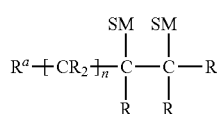

Chemical Formula 2-2

$$RRNCSSM \quad \text{Chemical Formula 2-3}$$

wherein
$R^a$ includes a substituted or unsubstituted C1 to C24 alkyl group, a substituted or unsubstituted C2 to C24 alkenyl group, and a substituted or unsubstituted C6 to C20 aryl group, R is the same or different, and is each independently hydrogen or a substituted or unsubstituted C1 to C24 alkyl group, n is an integer of 0 to 15, L is a direct bond, a sulfonyl (—S(=O)$_2$—), carbonyl (—C(=O)—), ether group (—O—), sulfide group (—S—), sulfoxide group (—S(=O)—), ester group (—C(=O)O—), amide group (—C(=O)NR—) (wherein R is hydrogen or a C1 to C10 alkyl group), a substituted or a unsubstituted C1 to C10 alkylene, a C2 to C10 alkenylene, or a combination thereof, and M is hydrogen, lithium, sodium, potassium, or a combination thereof
wherein the first ligand comprises a compound represented by Chemical Formula 1:

$$MA_n \quad \text{Chemical Formula 1}$$

wherein M is Mg, Ca, Zn, Ga, or In, n is determined depending on a valency of the M and is an integer of greater than or equal to 2, each A is the same or different, and is independently a C1 to C10 organic group, a halogen, or a combination thereof, and
wherein the first ligand comprises an organic metal salt, a halogenated metal, a hydrocarbyl metal, a hydrocarbyl metal halide, or a combination thereof,
wherein when a plurality of the quantum dots are included in a composition comprising a binder polymer having a carboxylic acid group and the composition is left at 4° C. for 144 hours, an increase of a viscosity of the composition is less than about 10% with respect to an initial viscosity of the composition.

2. The quantum dot of claim 1, wherein the semiconductor nanocrystal particle comprises a Group II-VI compound, a Group III-V compound, a Group IV-VI compound, a Group IV element or compound, a Group compound, a Group I-II-IV-IV compound, or a combination thereof.

3. The quantum dot of claim 1, wherein the semiconductor nanocrystal particle comprises a core comprising a first semiconductor nanocrystal and a shell disposed on the core, and comprising a second semiconductor nanocrystal.

4. The quantum dot of claim 1, wherein the A of Chemical Formula 1 comprises a C2 to C5 organic functional group.

5. The quantum dot of claim 1, wherein the A of Chemical Formula 1 comprises a C2 to C5 hydrocarbyl group, RCOO— or ROCO— (wherein R is a C1 to C4 hydrocarbyl group), fluorine, chlorine, bromine, iodine, or a combination thereof.

6. The quantum dot of claim 1, wherein the first ligand comprises a metal that is the same as a metal present on the surface of the quantum dot.

7. The quantum dot of claim 1, wherein the first ligand comprises indium chloride, cadmium chloride, aluminum chloride, iron chloride, manganese chloride, diethyl zinc, dipropyl zinc, triethyl aluminum, tributyl aluminum, a zinc carboxylate, a zinc (meth)acrylate, zinc chloride, indium acetate, or a combination thereof.

8. The quantum dot of claim 1, wherein the first ligand comprises a zinc acetate, a zinc propionate, a zinc butyrate, a zinc (meth)acrylate, a zinc chloride, or a combination thereof.

9. The quantum dot of claim 1, wherein the second ligand comprises a substituted or unsubstituted C1 to C40 alkyl thiol compound, a C2 to C40 mercapto carboxylic acid compound, a C2 to C40 mercapto carboxylic acid alkyl ester compound, a dithiocarbamic acid or dithiocarbamate compound comprising a C1 to C40 alkyl group, or a combination thereof.

10. The quantum dot of claim 1, wherein the second ligand comprises butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutyl mercaptoacetate, thioglycolic acid, 3-mercaptopropionic acid, thiopronine, 2-mercaptopropionic acid, 2-mercaptopropionate, 2-mercaptoethanol, cysteamine, 1-thioglycerol, mercaptosuccinic acid, L-cysteine, dihydrolipoic acid, 2-(dimethylamino)ethanethiol, 5-mercaptomethyl tetrazole, 2,3-dimercapto-1-propanol glutathione, m(PEG)-SH, di(C1 to C30 alkyl)dithiocarbamic acid, di(C1 to C30 alkyl)dithiocarbamate, or a combination thereof.

11. The quantum dot of claim 1, wherein the quantum dot has a 5% weight loss temperature of less than or equal to about 400° C. as determined by a thermogravimetric analysis.

12. A composition comprising:
the quantum dot of claim 1;
a binder polymer;
a polymerizable monomer comprising a carbon-carbon double bond; and
a photoinitiator.

13. The composition of claim 12, wherein the binder polymer comprises a copolymer of a monomer combination comprising a first monomer comprising a carboxylic acid group and a carbon-carbon double bond, a second monomer comprising a carbon-carbon double bond and a hydrophobic moiety and not comprising a carboxylic acid group, and optionally, a third monomer comprising a carbon-carbon double bond and a hydrophilic moiety and not comprising a carboxylic acid group;
a multiple aromatic ring-containing polymer comprising a carboxylic acid group and comprising a backbone structure in a main chain, wherein the backbone structure comprises a quaternary carbon atom, which is a part of a cyclic group, and two aromatic rings bound to the quaternary carbon atom; or
a combination thereof.

14. The composition of claim 13, wherein the copolymer comprises a first repeating unit derived from the first monomer, a second repeating unit derived from the second monomer, and optionally, a third repeating unit derived from the third monomer, wherein the first repeating unit comprises a unit represented by Chemical Formula 3-1, a unit represented by Chemical Formula 3-2, or a combination thereof:

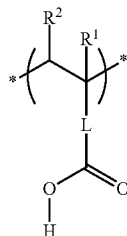

Chemical Formula 3-1 wherein
$R^1$ is hydrogen, a C1 to C3 alkyl group, or —$(CH_2)_n$—COOH (wherein n is 0 to 2),
$R^2$ is hydrogen, a C1 to C3 alkyl group, or —COOH,
L is a single bond, a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, and
* indicates a portion linked to an adjacent atom;

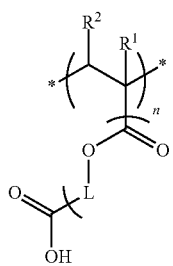

Chemical Formula 3-2 wherein
$R^1$ is hydrogen, a C1 to C3 alkyl group, or —$(CH_2)_n$—COOH (wherein n is 0 to 2),
$R^2$ is hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
n is an integer of 1 to 3, and
* indicates a portion linked to an adjacent atom;
the second repeating unit comprises a repeating unit represented by Chemical Formula 4-1, a repeating unit represented by Chemical Formula 4-2, a repeating unit represented by Chemical Formula 4-3, a repeating unit represented by Chemical Formula 4-4, or a combination thereof:

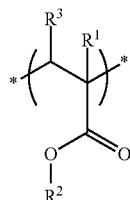

Chemical Formula 4-1 wherein
$R^1$ is hydrogen or a C1 to C3 alkyl group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group,
* indicates a portion linked to an adjacent atom;

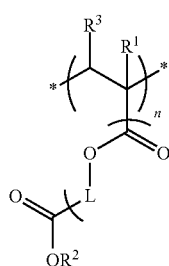

Chemical Formula 4-2 wherein
$R^1$ is hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group,
n is an integer of 1 to 3, and
* indicates a portion linked to an adjacent atom;

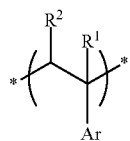

Chemical Formula 4-3 wherein
each of $R^1$ and $R^2$ is independently hydrogen or a C1 to C3 alkyl group, Ar is a substituted or unsubstituted C6 to C30 aromatic hydrocarbon group or a substituted or unsubstituted C3 to C30 alicyclic hydrocarbon group, and
* indicates a portion linked to an adjacent atom;

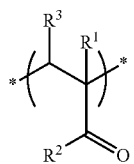

Chemical Formula 4-4 wherein
R¹ is hydrogen or a C1 to C3 alkyl group,
R² is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
R³ is hydrogen or a C1 to C3 alkyl group, and
* indicates a portion linked to an adjacent atom;
wherein the third repeating unit is represented by Chemical Formula 5:

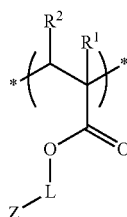

Chemical Formula 5 wherein
each of R¹ and R² is independently hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
Z is a hydroxyl group (—OH), a mercapto group (—SH), or an amino group (—NHR, wherein R is hydrogen or a C1 to C5 alkyl group), and
* indicates a portion linked to an adjacent atom, and
the backbone structure of the multiple aromatic ring-containing polymer comprises a unit represented by Chemical Formula A:

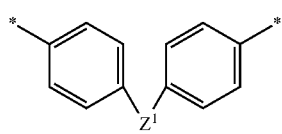

Chemical Formula A wherein
* indicates a portion that is linked to an adjacent atom of the main chain of the binder,
Z¹ is a linking moiety represented by any one of Chemical Formulae A-1 to A-6, and in Chemical Formulae A-1 to A-6, * indicates a portion that is linked to the aromatic ring:

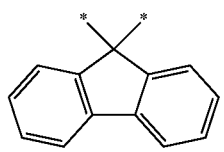

Chemical Formula A-1

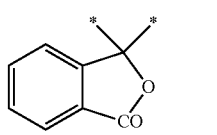

Chemical Formula A-2

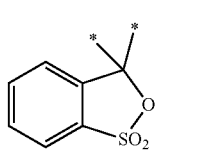

Chemical Formula A-3

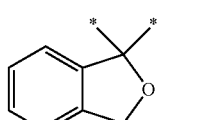

Chemical Formula A-4

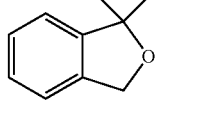

Chemical Formula A-5

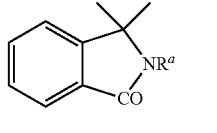

wherein $R^a$ is hydrogen, an ethyl group, $C_2H_4Cl$, $C_2H_4OH$, $CH_2CH=CH_2$, or a phenyl group, Chemical Formula A-6

15. The composition of claim 12, wherein the binder polymer has an acid value of greater than or equal to about 50 milligrams of KOH per gram of the polymer and of less than or equal to about 250 milligrams of KOH per gram of the polymer.

16. The composition of claim 12, wherein the composition further comprises a thiol compound represented by Chemical Formula 6:

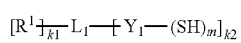

Chemical Formula 6 wherein
R¹ comprises hydrogen, a substituted or unsubstituted C1 to C30 linear or branched alkyl group, a substituted or unsubstituted C1 to C30 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH$_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously); an isocyanate group; a halogen; —ROR' (wherein R is a substituted or unsubstituted C1 to C20 alkylene group and R' is hydrogen or a C1 to C20 linear or branched alkyl group); an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group), or a combination thereof, L$_1$ comprises a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, or a substituted or unsubstituted C1 to C30 alkylene group comprising at least one methylene (—CH$_2$—) replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, Y$_1$ comprises a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that m does not exceed the valence of Y$_1$ when Y$_1$ is not a single bond, and provided that a sum of k1 and k2 does not exceed the valence of L$_1$.

17. The composition of claim 16, wherein the thiol compound comprises ethoxylated pentaerythritol tetra(3-mercaptopropionate), trimethylolpropane tri(3-mercaptopropionate), trimethylolpropane-tri(2-mercaptoacetate), a C1 to C10 alkylene glycol di-3-mercaptopropionate, polypropylene glycol di(3-mercaptopropionate), ethoxylated trimethylolpropane tri(3-mercaptopropionate), glycol dimercaptoacetate, ethoxylated glycol dimercaptoacetate, 1,4-bis(3-mercaptobutyryloxy)butane, tris[2-(3-mercaptopropionyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol comprising 1 to 10 ethylene glycol repeating units, or a combination thereof.

18. The composition of claim 12, wherein the polymerizable monomer comprising a carbon-carbon double bond comprises a monomer comprising at least one (meth)acrylate moiety.

19. The composition of claim 12, wherein the composition comprises a plurality of the quantum dots, and based on a total amount of the composition:

about 1 weight percent to about 60 weight percent of the quantum dots;

about 0.5 weight percent to about 60 weight percent of the binder polymer;

about 0.5 weight percent to about 70 weight percent of the polymerizable monomer;

about 0.01 weight percent to about 10 weight percent of the photoinitiator; and a balance amount of solvent.

20. A quantum dot-polymer composite comprising:

a polymer matrix; and a plurality of quantum dots dispersed in the polymer matrix;

wherein the plurality of quantum dots comprises the quantum dot of claim 1.

21. The quantum dot-polymer composite of claim 20, wherein the polymer matrix comprises a thiol-ene polymer, a (meth)acrylate polymer, a urethane polymer, an epoxy polymer, a vinyl polymer, a silicone polymer, or a combination thereof.

22. An electronic device comprising the quantum dot of claim 1.

23. A layered structure comprising:

a transparent substrate; and a photoluminescent layer disposed on the transparent substrate and comprising a pattern of a quantum dot polymer composite, wherein the quantum dot polymer composite comprises a polymer matrix and a plurality of quantum dots dispersed in the polymer matrix, the plurality of quantum dots comprises the quantum dot of claim 1, and the pattern of the quantum dot polymer composite comprises a first section emitting a first light and a second section emitting a second light.

24. The layered structure of claim 23, wherein the polymer matrix comprises a crosslinked polymer and a polymer comprising a carboxylic acid group.

25. The layered structure of claim 24, wherein the crosslinked polymer comprises a thiol-ene polymer, a crosslinked poly(meth)acrylate, or a combination thereof.

26. A method of producing the layered structure of claim 23, the method comprising:

forming a film of a quantum dot composition on the transparent substrate;

exposing a selected area of the film to light; and developing the exposed selected area of the film with an alkaline developer to obtain the pattern of the quantum dot polymer composite, wherein the quantum dot composition comprises the plurality of the quantum dots, a binder polymer, a polymerizable monomer comprising a carbon-carbon double bond, and a photoinitiator.

27. A display device comprising:
a backlight unit comprising a light source to provide a third light,
a lower substrate disposed on the backlight unit;
the layered structure of claim 23; and
a liquid crystal layer interposed between the lower substrate and the layered structure, wherein the layered structure is disposed such that the photoluminescent layer faces the liquid crystal layer.

28. The quantum dot of claim 1, wherein the first ligand comprises zinc acrylate, zinc chloride, or a combination thereof and the second ligand comprises a compound represented by Chemical Formula 2-1

$$R^a\text{-L-}(CRR)_n SM$$

$R^a$ includes an unsubstituted C1 to C24 alkyl group, an unsubstituted C2 to C24 alkenyl group, and an unsubstituted C6 to C20 aryl group, R is the same or different, and is each independently hydrogen or an unsubstituted C1 to C24 alkyl group, n is an integer of 0 to 15, L is a direct bond, a sulfonyl (—S(=O)2-), carbonyl (—C(=O)—), ether group (—O—), sulfide group (—S—), sulfoxide group (—S(=O)—), ester group (—C(=O)O—), amide group (—C(=O)NR—) (wherein R is hydrogen or a C1 to C10 alkyl group), an unsubstituted C1 to C10 alkylene, a C2 to C10 alkenylene, or a combination thereof, and M is hydrogen, lithium, sodium, potassium, or a combination thereof.

29. The quantum dot of claim 1, wherein an amount of the second ligand is greater than or equal to about 0.1 moles and less than or equal to about 10 moles, per one mole of the first ligand.

\* \* \* \* \*